United States Patent [19]

Bulucea et al.

[11] Patent Number: 5,072,266
[45] Date of Patent: Dec. 10, 1991

[54] TRENCH DMOS POWER TRANSISTOR WITH FIELD-SHAPING BODY PROFILE AND THREE-DIMENSIONAL GEOMETRY

[75] Inventors: Constantin Bulucea, Sunnyvale; Rebecca Rossen, Palo Alto, both of Calif.

[73] Assignee: Siliconix Incorporated, Santa Clara, Calif.

[21] Appl. No.: 290,546

[22] Filed: Dec. 27, 1988

[51] Int. Cl.$^5$ .................... H01L 29/10; H01L 29/78; H01L 29/68; H01L 27/01
[52] U.S. Cl. ................... 357/23.4; 357/23.1; 357/23.8; 437/38
[58] Field of Search ............ 357/23.4, 23.8, 23.1; 437/38

[56] References Cited

U.S. PATENT DOCUMENTS

| | | | |
|---|---|---|---|
| 4,593,302 | 6/1986 | Lidow et al. | 357/23.4 |
| 4,631,564 | 12/1986 | Neilson et al. | 357/23.4 |
| 4,663,644 | 5/1987 | Shimizu | 357/23.4 |
| 4,680,853 | 7/1987 | Lidow et al. | |
| 4,767,722 | 8/1988 | Blanchard | 357/23.4 |
| 4,794,561 | 12/1988 | Hsu | 357/23.4 |
| 4,824,793 | 4/1989 | Richardson et al. | 437/38 |
| 4,893,160 | 1/1990 | Blanchard | 357/23.4 |

OTHER PUBLICATIONS

Bulucea, C., "Avalanche Injection into the Oxide in Silicon Gate-Controlled Devices I. Theory", Solid-State Electronics, 1975, vol. 18, pp. 363–374.
Bulucea, C., "Avalanche Injection into the Oxide in Silicon Gate-Controlled Devices II. Experimental Results" Solid-State Electronics, 1975, vol. 18, pp. 381–391.
Marcus and Sheng, "The Oxidation of Shaped Silicon Surfaces", Journal Electrochemical Society: Solid-State Science and Technology, vol. 129, (1982), pp. 1278–1282.
D. Ueda, H. Takagi and G. Kano, "A New Vertical Power MOSFET Structure with Extremely Reduced On-Resistance" IEEE Trans. Electron Devices, vol. ED-32 (1985) pp. 2–6.
H. R. Chang et al., "Self-Aligned UMOSFET's with a Specific On-Resistance of 1 mΩ-cm$^2$" IEEE Trans. Electron Devices, vol. ED-34 (1987) pp. 2329–2334.
Wilson and Marcus, "Oxidation of Curved Silicon Surfaces", Journal Electrochemical Society: Solid-State Science and Technology, vol. 134 (1987) pp. 481–490.
K. Yamabe and K. Imai "Nonplanar Oxidation and Reduction of Oxide Leakage Currents at Silicon Corners by Rounding-Off Oxidation" IEEE Trans. Electron Devices, vol. ED-34 (1987) pp. 1681–1687.

Primary Examiner—Jerome Jackson, Jr.
Assistant Examiner—Daniel Y. J. Kim
Attorney, Agent, or Firm—Skjerven, Morrill, MacPherson, Franklin & Friel

[57] ABSTRACT

Power MOSFET apparatus, and method for its production, that suppresses voltage breakdown near the gate, using a polygon-shaped trench in which the gate is positioned in order to suppress oxide dielectric breakdown, using a shaped deep body junction that partly lies below the trench bottom to force voltage breakdown away from the trench surfaces and into the bulk of the semiconductor material, and using special procedures for growth of gate oxide at various trench corners.

14 Claims, 36 Drawing Sheets

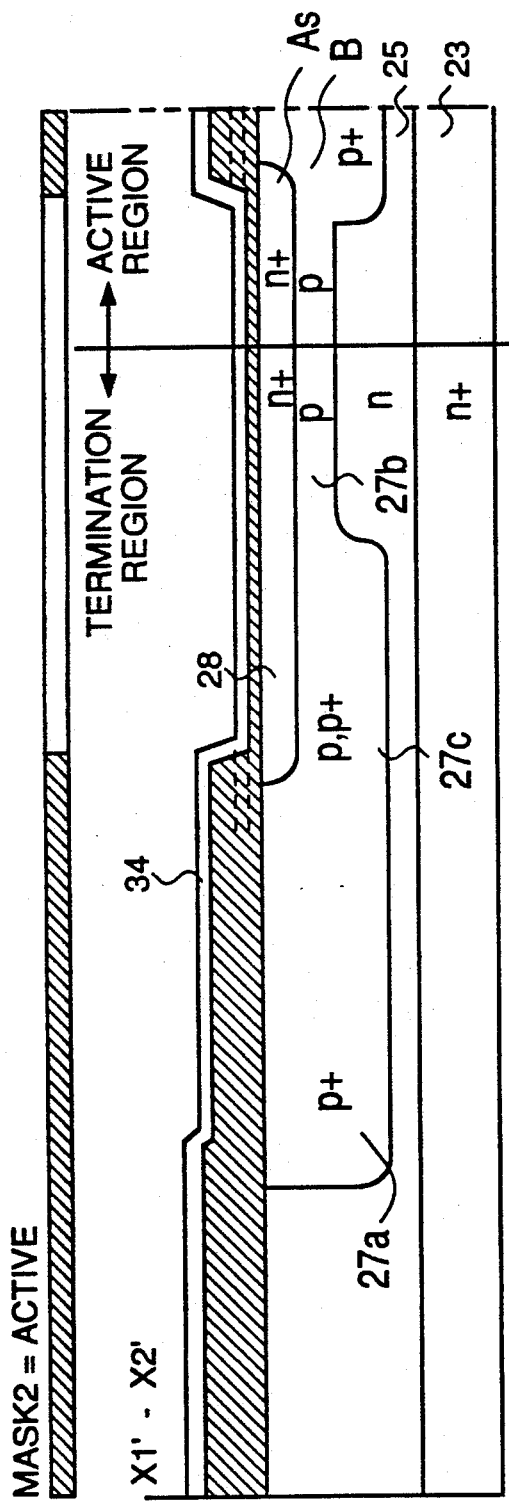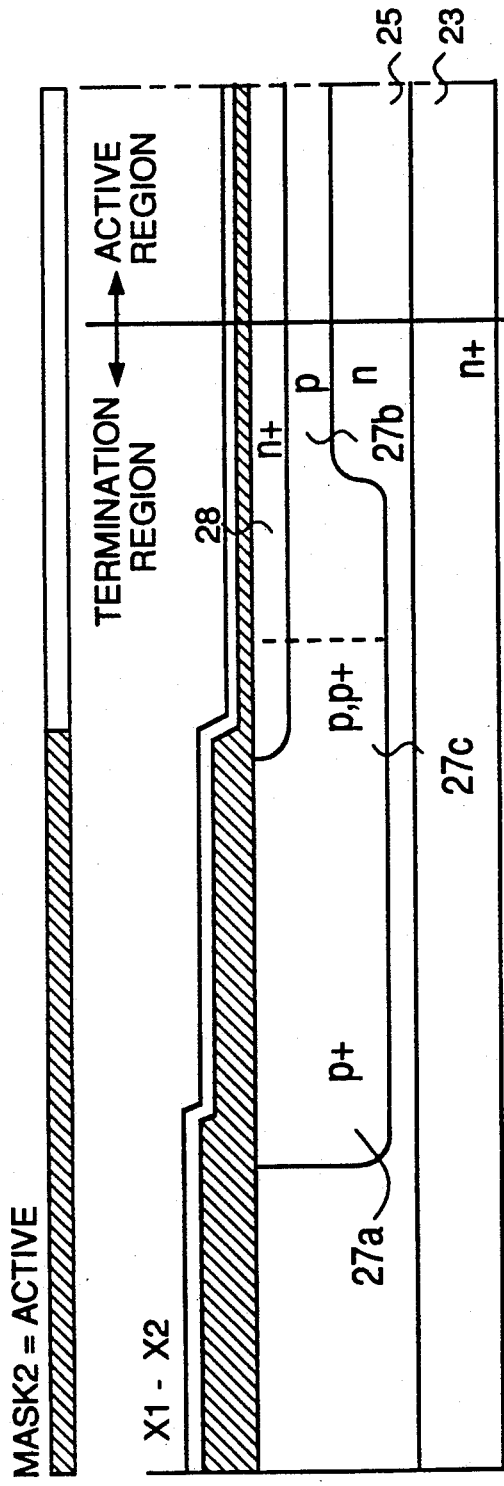
FIG. 23A
FIG. 23B

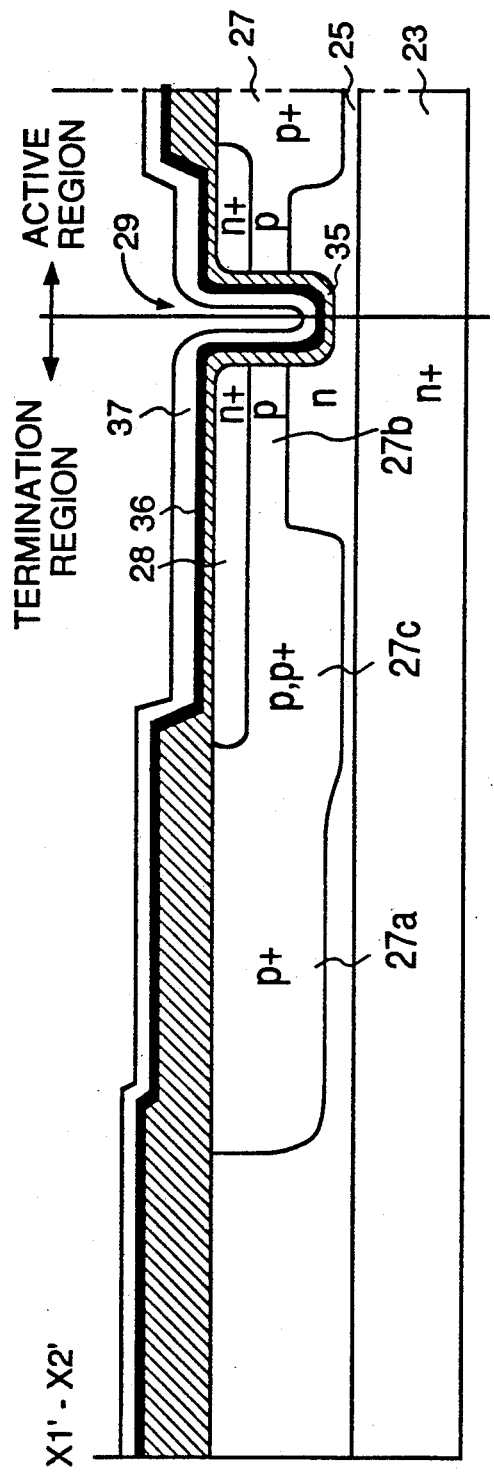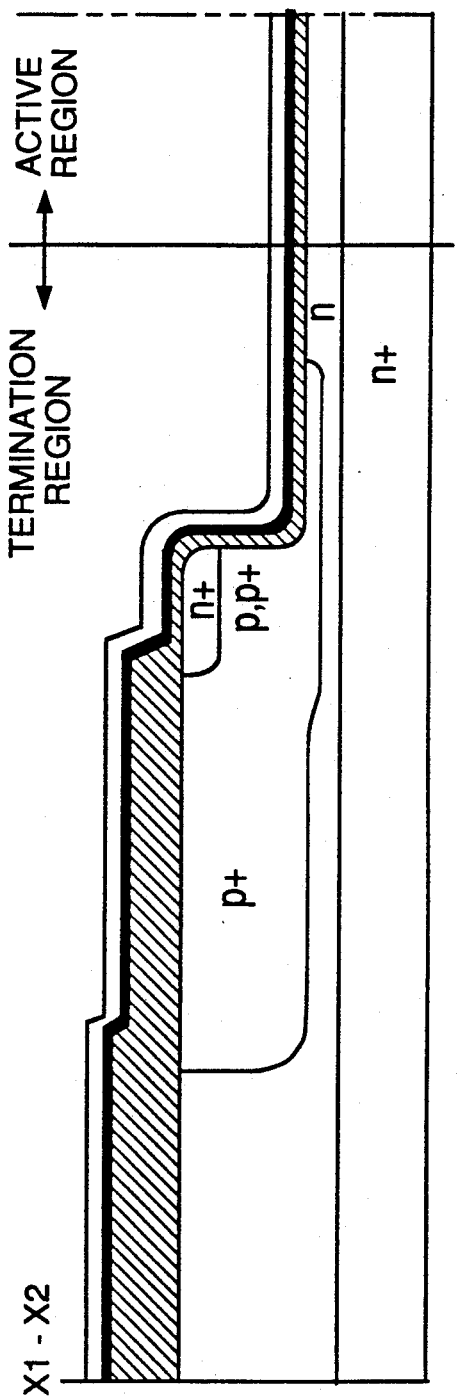
FIG. 26A
FIG. 26B

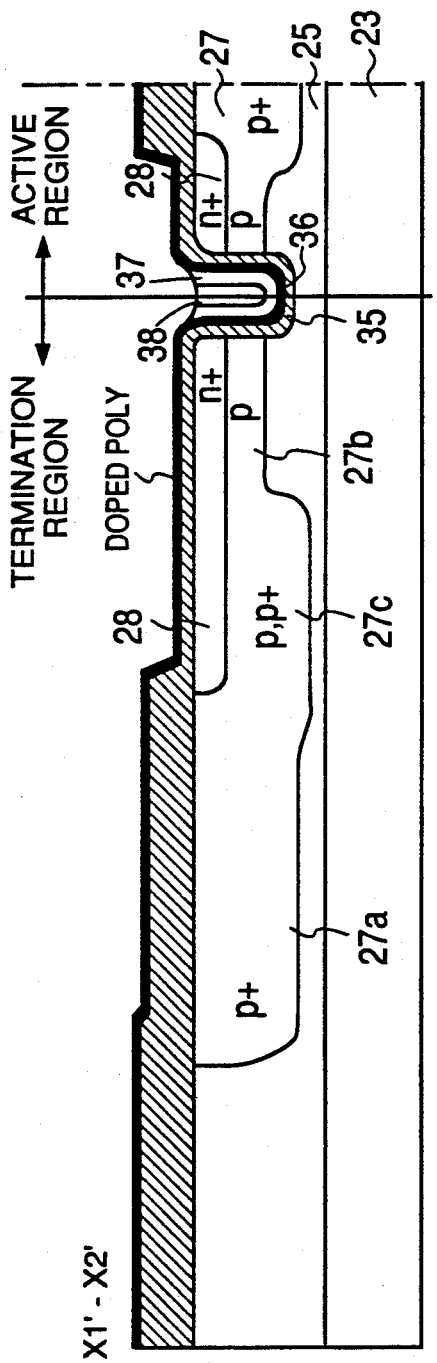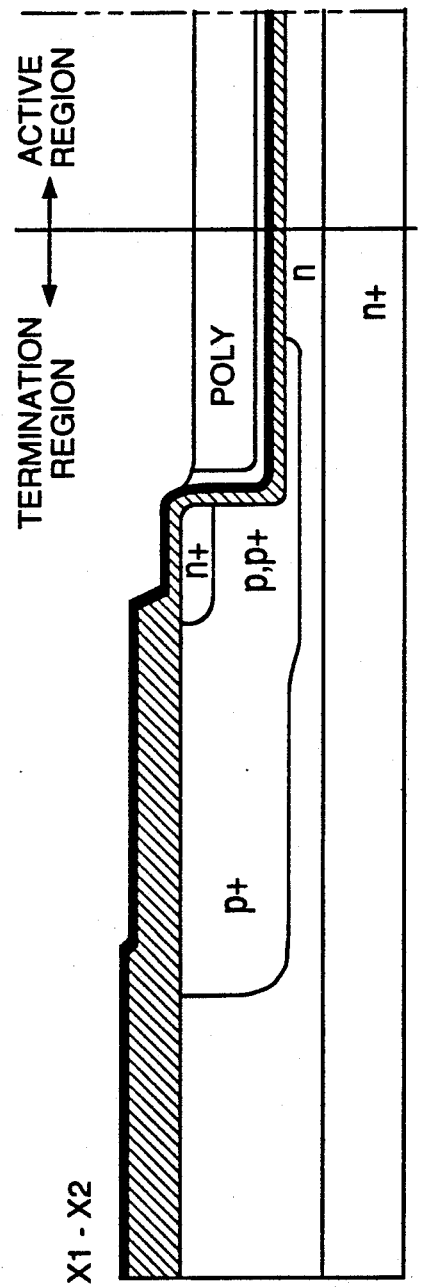
FIG. 28A
FIG. 28B

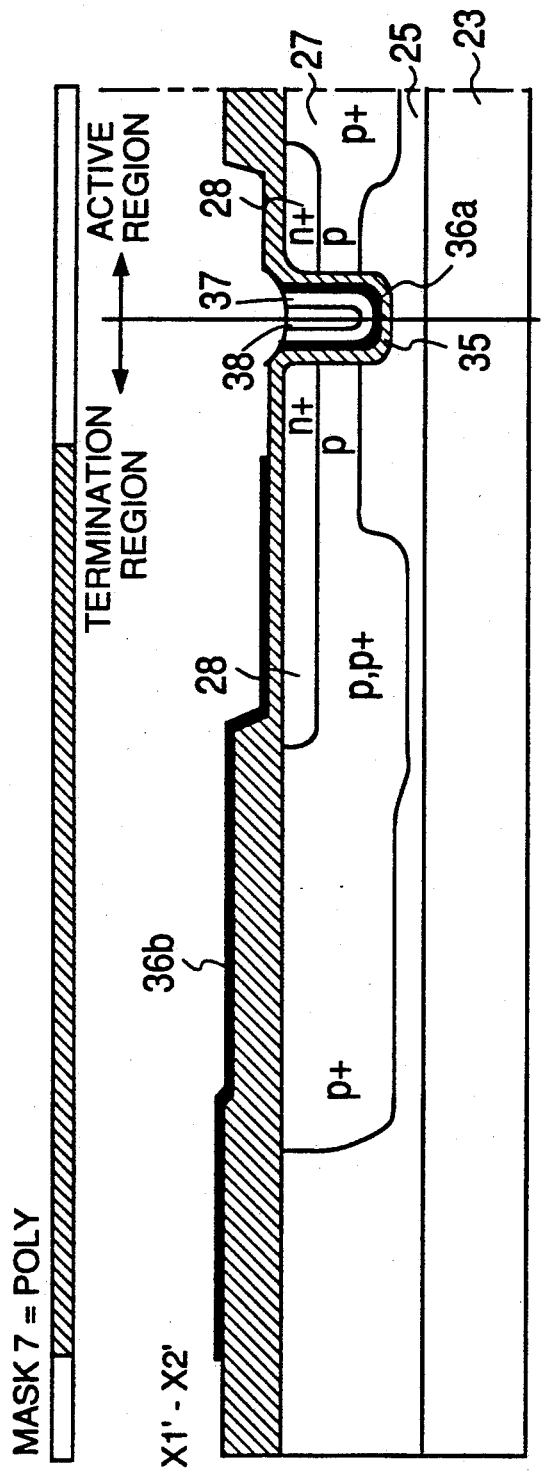
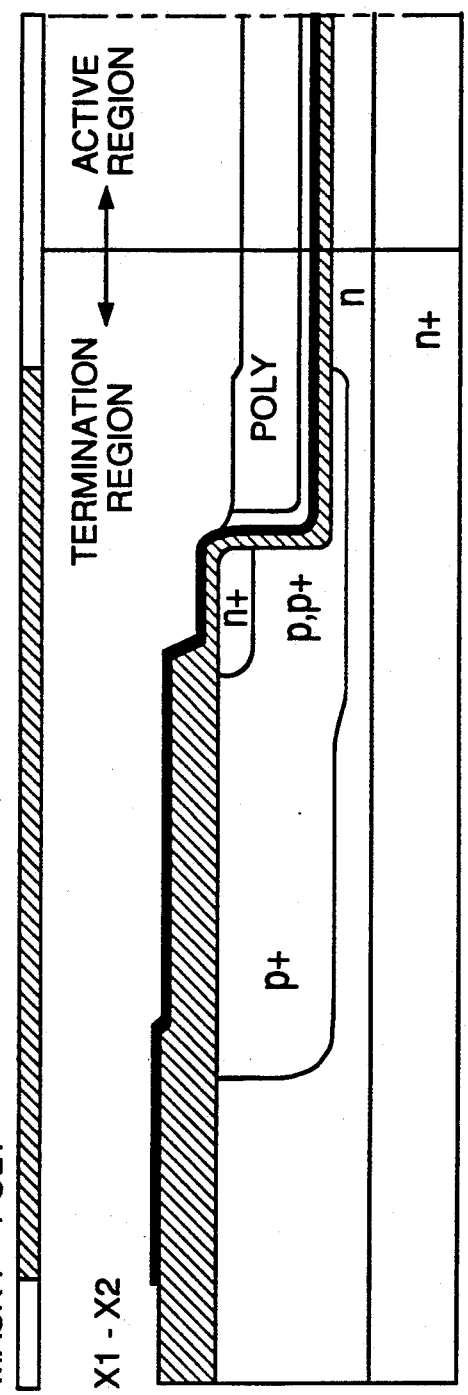
FIG. 29A
FIG. 29B

TRENCH DMOS POWER TRANSISTOR WITH FIELD-SHAPING BODY PROFILE AND THREE-DIMENSIONAL GEOMETRY

FIELD OF THE INVENTION

This invention relates to power switching transistors and more particularly to vertical MOSFETs that have a gate region located in a "trench" in the semiconductor material

BACKGROUND OF THE INVENTION

MOSFET semiconductor devices in which the gate is formed in a vertically oriented groove in the semiconductor material so that current flow is substantially vertical, have been studied recently by several workers in the field. Ueda, Takagi and Kano, in IEEE Trans. on Electron Devices, Vol ED-32 (1985) 2-6, have studied the formation of vertically oriented rectangular grooves by a reactive ion beam etching technique, where the structure manifests reduced on-resistance and high cell packing density. Chang and co-workers, in a series of papers, have also studied formation of vertically oriented rectangular grooves, produced by photolithographic techniques, in semiconductor material and self-alignment of the groove boundaries. See, for example, H. R. Chang, et al., IEEE Trans. on Electron Devices, Vol ED-34 (1987) 2329-2334 and references cited therein. Blanchard, in U.S. Pat. No. 4,767,722, discloses a method for making vertical channel DMOS structures including the use of a vertically oriented rectangular groove filled with doped polysilicon that serves as a gate.

In another research direction, Marcus, Wilson and co-workers have discussed the effects of oxidization on curved silicon surfaces of various shapes, including right angle corners and cylinders and cylindrical cavities. See, for example, Marcus and Sheng, Jour. Electrochemical Soc., Vol. 129 (1982) 1278-1282; Wilson and Marcus, Jour Electrochemical Soc., Vol. 134 (1987). See also Yamabe and Imai, IEEE Trans. on Electron Devices, Vol ED-34 (1987) 1681-1687.

Lidow and Herman, in U.S. Pat. Nos. 4,593,302 and 4,680,853, disclose the fabrication of planar power MOSFETs having hexagonally shaped source cells with hexagonally shaped channels being formed beneath the source region in the semiconductor material.

SUMMARY OF THE INVENTION

This invention provides an optimized version of a power metal-oxide-semiconductor field-effect transistor (MOSFET) that has the gate region positioned in a vertically oriented groove or "trench" that extends from the top surface of the structure downward, using a three-dimensional cell geometry that maximizes the gate dielectric breakdown voltage and also provides position of voltage breakdown initiation to allow use of controlled bulk semiconductor breakdown Bulk breakdown is achieved by using a two-dimensional, field shaping, dopant profile that includes a central deep p+ (or n+) layer that is laterally adjacent to a p body layer and that is vertically adjacent to an epitaxial layer of appropriate thickness and a gate dielectric of appropriate thickness in a trench.

These objects may be realized in accordance with this invention by apparatus that includes:

A substrate of first conductivity type, a first covering layer of first conductivity type lying on the substrate, a second covering layer of second conductivity type lying on the first covering layer and having a bottom surface, and a third covering layer of heavily doped first conductivity type having a top surface and partly lying over the second covering layer, where a portion of the second covering layer is heavily doped and extends vertically upward through a portion of the third covering layer to the top surface of the third covering layer The apparatus also includes a trench having a bottom surface and side surfaces and extending downward from the top surface of the third covering layer, through the third and second covering layers and through a portion of the first covering layer, where the bottom surface of the trench lies above a lowest part of the bottom surface of the second covering layer. Electrically conducting material is positioned in the trench, and an oxide layer is positioned between this electrically conducting material and the trench bottom and side surfaces. Finally, three electrodes are attached to the electrically conducting material, to the third covering layer, and to the substrate, respectively. This apparatus allows the transistor to avoid initiation of avalanche breakdown adjacent to the trench.

BRIEF DESCRIPTION OF THE DRAWINGS

FIGS. 22A, 22B through 31A, 31B illustrate the results of ten groups of related process steps that may be used to produce the apparatus shown in FIG. 8. FIGS. 22A and 22B cross-sectional views defined by the planes indicated as $X_1'X_2'$ and $X_1X_2$, respectively, in FIG. 21; and the other Figures in this group have similar interpretations.

DETAILED DESCRIPTION

(A) Device Description

Figure 1:
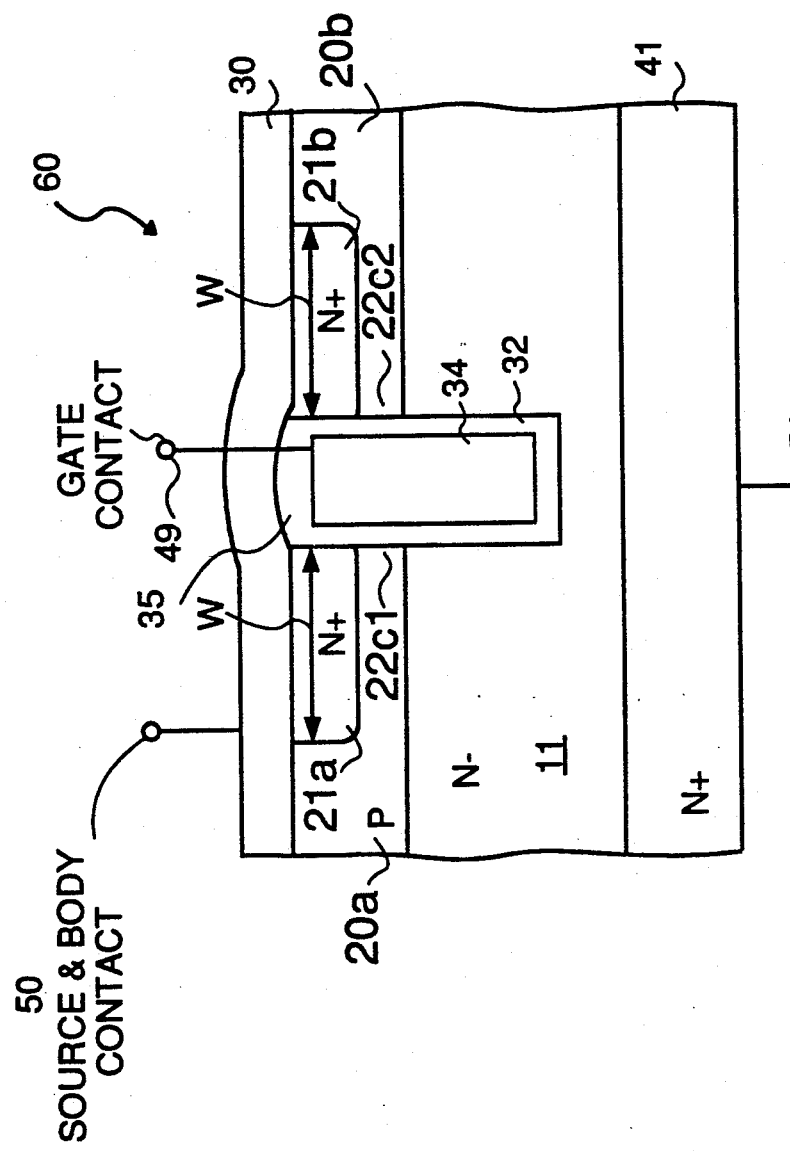
FIG. 1 is a schematic cross-sectional view of a trench DMOS power transistor cell in the prior art.

FIG. 1 illustrates a representative MOSFET with the gate positioned in a vertically oriented rectangular trench, as shown in the prior art. This structure is often called a trench vertical DMOSFET. It is "vertical" because the drain contact appears on the back or underside of the substrate and because the channel flow of current from source to drain 24 is approximately vertical. This minimizes the higher resistance associated with bent or curved current paths or with parasitic field effect construction. The device is also doubly diffused (prefix "D") because the source region is diffused into the epitaxial material on top of a portion of the earlier-diffused body region of opposite conductivity type. This structure uses the trench side wall area rather than other silicon surface area for current control by the gate and has a substantially vertical current flow associated with it. This structure is particularly appropriate for power switching transistors where the current carried through a given transverse silicon area is to be maximized.

Figure 2A:
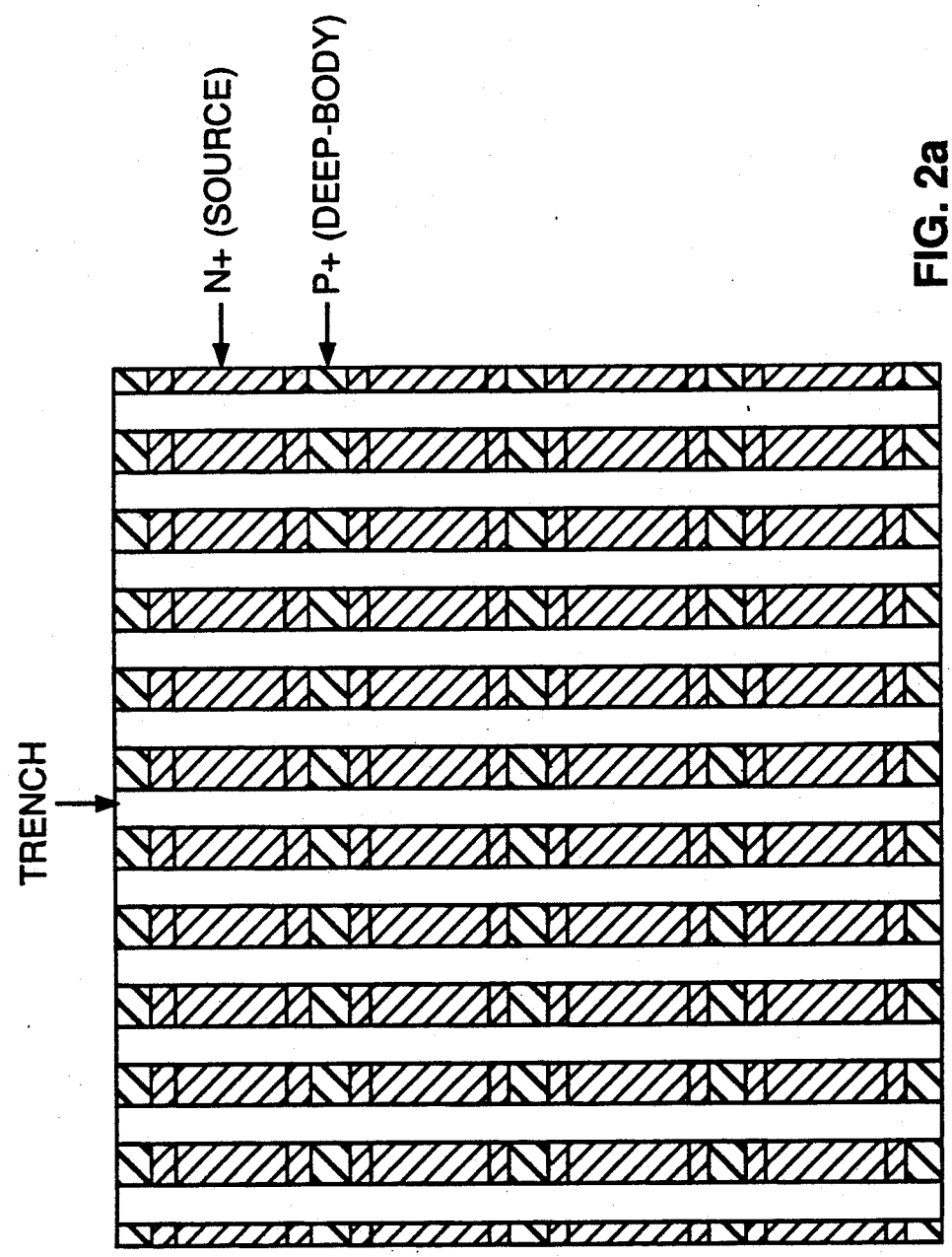
FIG. 2A is a schematic illustration of a trench DMOS power transistor, constructed in an open-cell or stripe geometry.
Figure 2B:
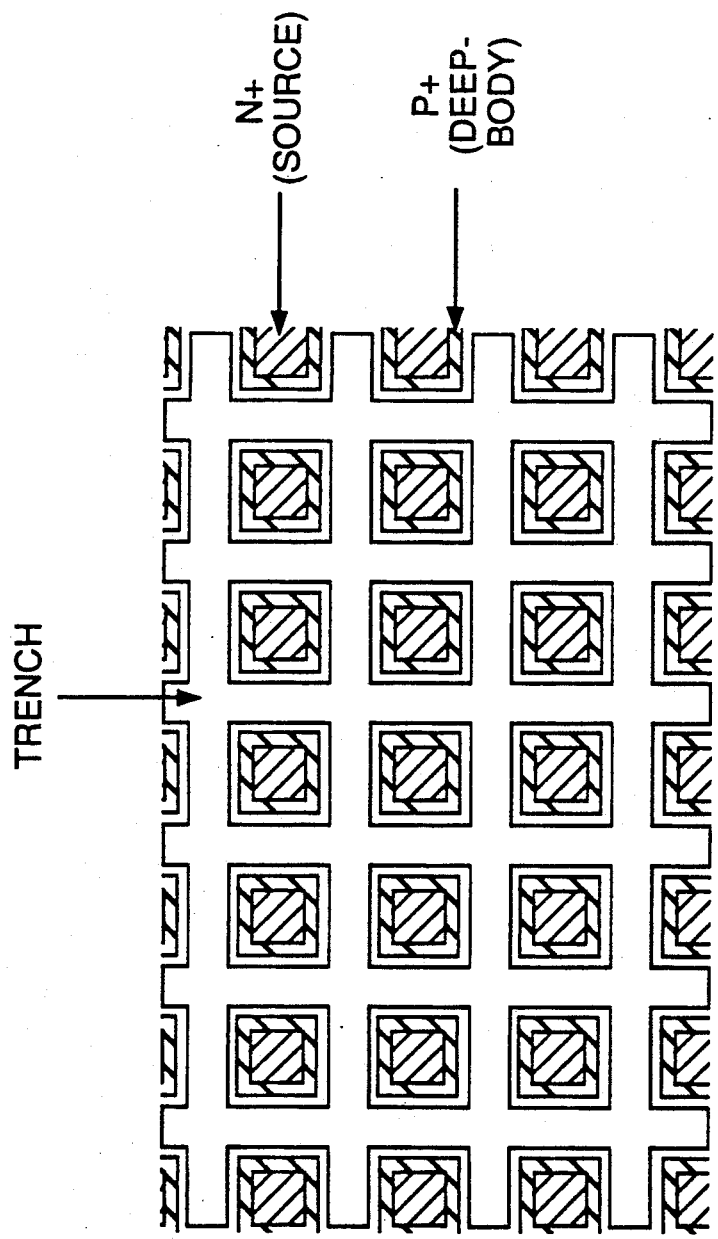
FIG. 2B is a schematic illustration of a trench DMOS power transistor, constructed in a closed-cell geometry.

Two types of trench DMOSFET layouts have been proposed by workers in the field, and these are shown in FIGS. 2A and 2B. The open-cell or stripe geometry shown in FIG. 2A has been reported in papers published by Matsushita Electric Company in Japan and by General Electric Company in the United States. This implementation results in a surface packing density that is superior to the closed-cell geometry illustrated in FIG. 2B. However, the open-cell or stripe geometry is inherently more susceptible to "bipolar breakdown", which is controlled in part by the resistance between the intrinsic body region below the gate region and the body contact.

Figure 3A:
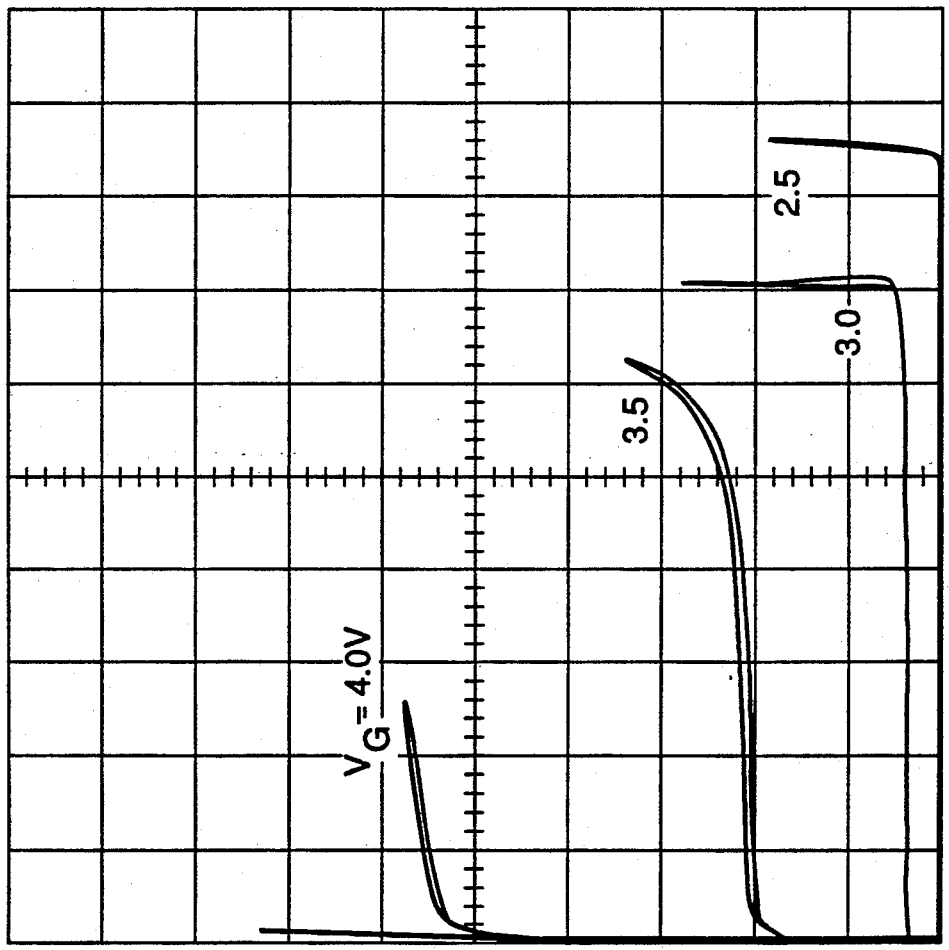
FIGS. 3A and 3B are graphic illustrations of the current versus applied voltage characteristics of a representative open-cell trench DMOS transistor that has distant and closely spaced body contacts, respectively.
Figure 3B:
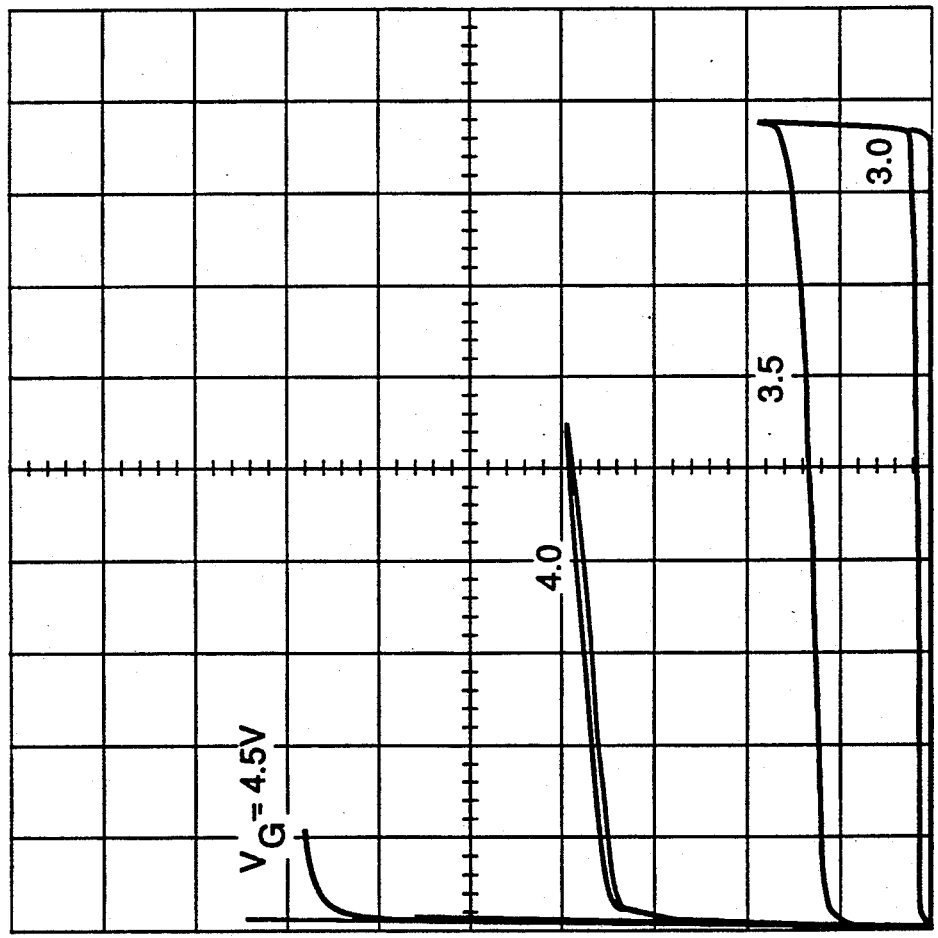

FIG. 3A shows the current versus voltage (I-V) characteristics of an open-cell DMOSFET built by the inventors hereof; this structure has p+ diffused body contacts placed perpendicular to the trench or trenches, and the distance between body contacts is 180 $\mu$m, which is relatively large. When the drain voltage exceeds a certain breakdown value, the bipolar breakdown phenomenon is manifest where the drain current increases prematurely for drain voltages below the drain-source junction breakdown voltage (BVDSS). FIG. 3B shows the output I-V characteristics of a similar transistor with more closely spaced body contacts, about 40 $\mu$m; this structure does not display the type of breakdown that is exhibited in FIG. 3A. However, the transistor corresponding to FIG. 3B is incapable of carrying as much current as does the device that corresponds to FIG. 3A, because of the greater body contact area in the FIG. 3B structure. An engineering trade-off must be made between on-resistance, breakdown voltage and other engineering figures of merit so that the perimeter-to-area ratio Z/A advantage of the open-cell is lost Given these constraints, the closed-cell geometry appears to be more practical. However, the closed-cell geometry has at least three associated problems that do not appear to have been reported on in the technical or patent literature.

Figure 4:
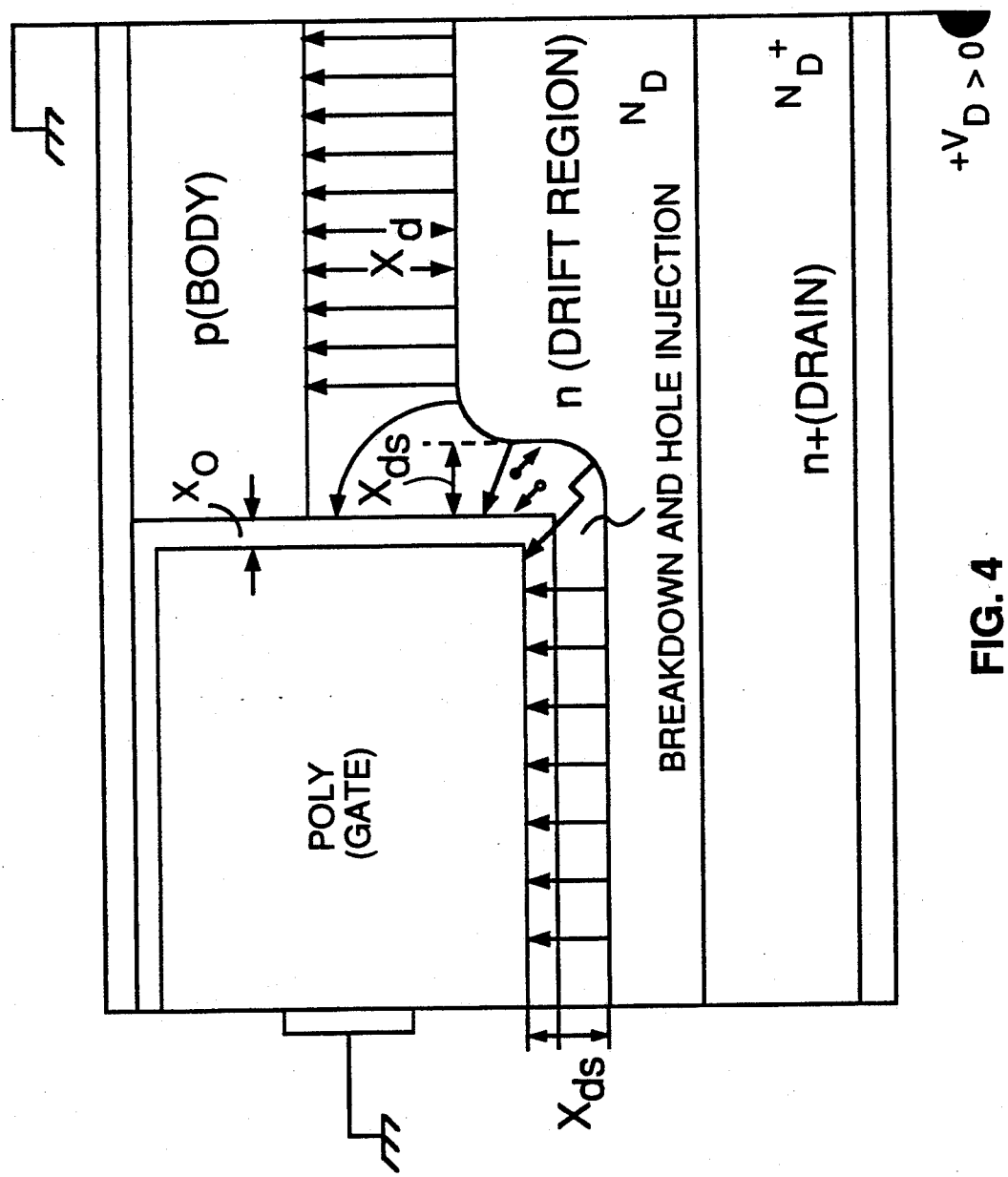
FIG. 4 is a schematic cross-sectional view of the electrical field structure in a trench DMOS transistor that has no deep body profile, indicating the site of initial voltage breakdown.

The first problem is semiconductor surface breakdown. The structure shown in FIG. 1, whether built in an open-cell or in a closed-cell geometry, has its body-drain junction terminated perpendicular to the long direction of the trench This junction is thus exposed to electric field line crowding and to breakdown in the epitaxial material adjacent to the bottom corners of the trench, when the device is biased in the BVDSS condition. This semiconductor surface breakdown carries with it an undesirable hot carrier injection effect, whereby high energy mobile carriers (holes, where the device is an n-channel MOSFET) are transported into the gate oxide. These carriers, created as electron-hole pairs by avalanche multiplication, are accelerated by the presence of the strong electric field, and some of the carriers of a given type (electrons or holes) reach the silicon-oxide interface with sufficient energy to overcome the energy barrier (approximately 3.65 eV for holes) present at the interface and thus move into the oxide. Hot carrier injection will occur if the position of maximum electrical field is within one mean free path (in the silicon) of the silicon-oxide interface. If no special precautions are taken, the maximum electrical field in the structure shown in FIG. 1 will unavoidably be at the interface so that hot carrier injection will occur as illustrated in FIG. 4.

In a n-channel (p-channel) DMOSFET, hot carrier injection leads to a positive (negative) charging of the gate oxide and the creation of a local electrical field that counteracts the electrical field provided by the gate voltage. The result is that the total electrical field in the nearby silicon is relaxed, relative to what the field would be in the absence of hot carrier injection, and the electrical field in the oxide is stressed further This relaxation of electrical field in the silicon causes an increase in the local breakdown voltage BVDSS This increase in breakdown voltage, commonly called "breakdown walk-out", indicates the presence of otherwise-unobservable hot carrier injections in the gate oxide region. An increase in BVDSS is not harmful, but the stressing of the gate oxide is a reliability concern because carrier injection can ultimately lead to irreversible oxide breakdown. Experiments have shown that electronic charges, after injection into silicon, are permanently trapped there at room temperature.

Figure 5:
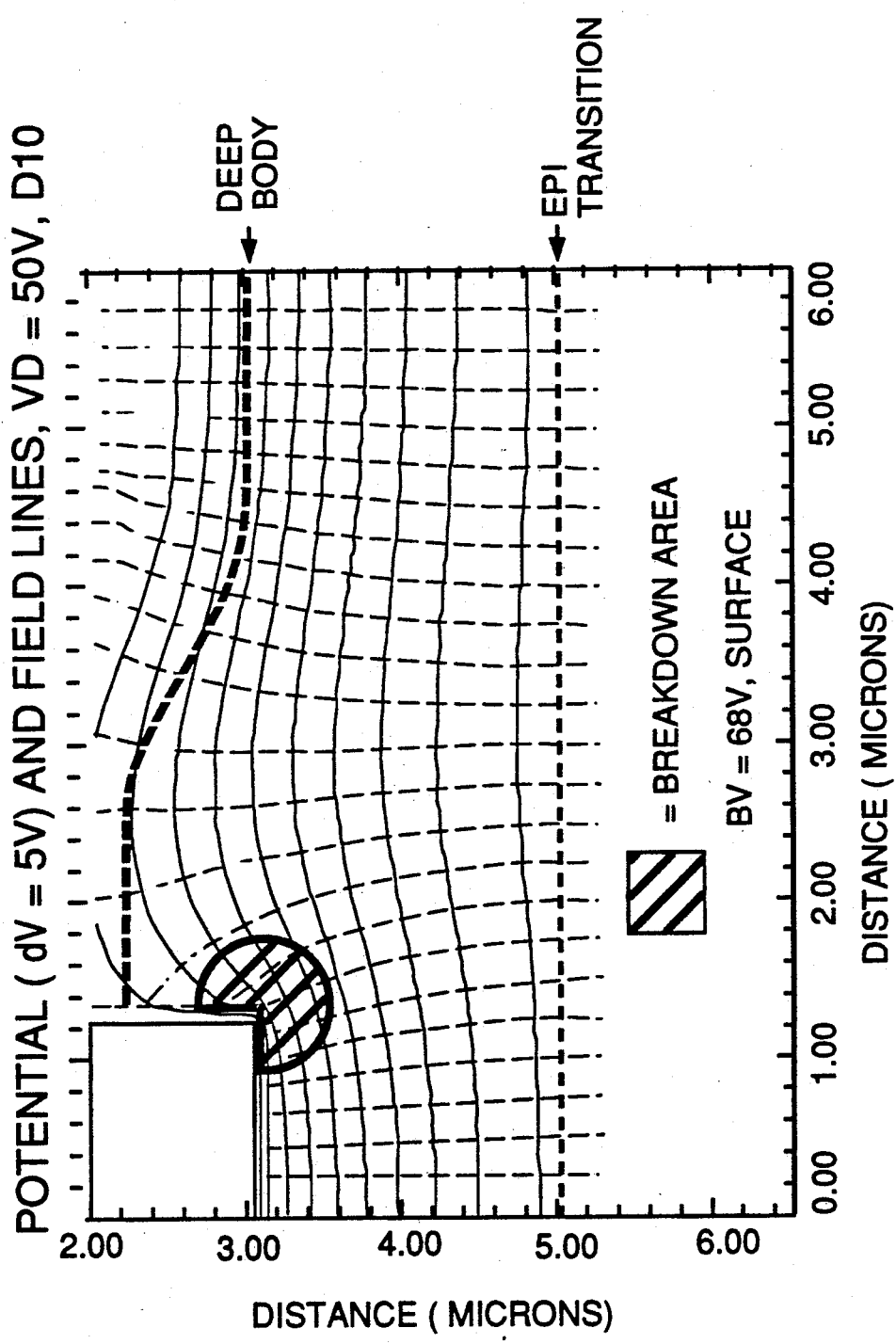
FIG. 5 is a graphic illustration of the results of a computer simulation of the electrical field lines in a trench DMOS transistor where the deep body junction is shallower than is the trench depth, indicating the site of initial voltage breakdown.

We have made measurements on test devices and have performed computer simulations that have revealed the presence of unacceptably heavy avalanche injection in trench DMOSFET structures that are made with no special provision to suppress semiconductor surface breakdown. FIG. 5 exhibits the results of one computer simulation, where the brackets placed on the electrical field lines indicate the areas of high electrical field strength (greater than $3 \times 10^5$ volts/cm in this example). Surface breakdown occurs adjacent to a trench corner in this example. If this breakdown can be forced into the bulk of the silicon material, away from the trench and gate oxide, the junction breakdown is no longer associated with irreversible oxide phenomena.

Equally important to the hot-carrier injection problem, surface breakdown is undesirable from the point of view of position of the source of avalanche-generated carriers relative to the body contact. If surface breakdown takes place adjacent to the trench, holes (electrons) flow laterally inside the p- (n-) region, toward the body contact This forward biases the source-to-body junction and brings the transistor into a bipolar breakdown mode, latch-back. Hence, for a latch-back-free design, the drain breakdown must be controlled such that breakdown occurs on the contact side of the p- (n-) region, thus avoiding lateral current flow in the high-resistivity body region.

Planar DMOS transistors do not have the surface breakdown problem, due to their intrinsic topology. These transistors use the merger at the surface of depletion regions of two adjacent cells, under the gate, thus uniformizing the field structure at the surface. In other words, the planar transistors benefit from the field shaping determined by cell placement.

Figure 6:
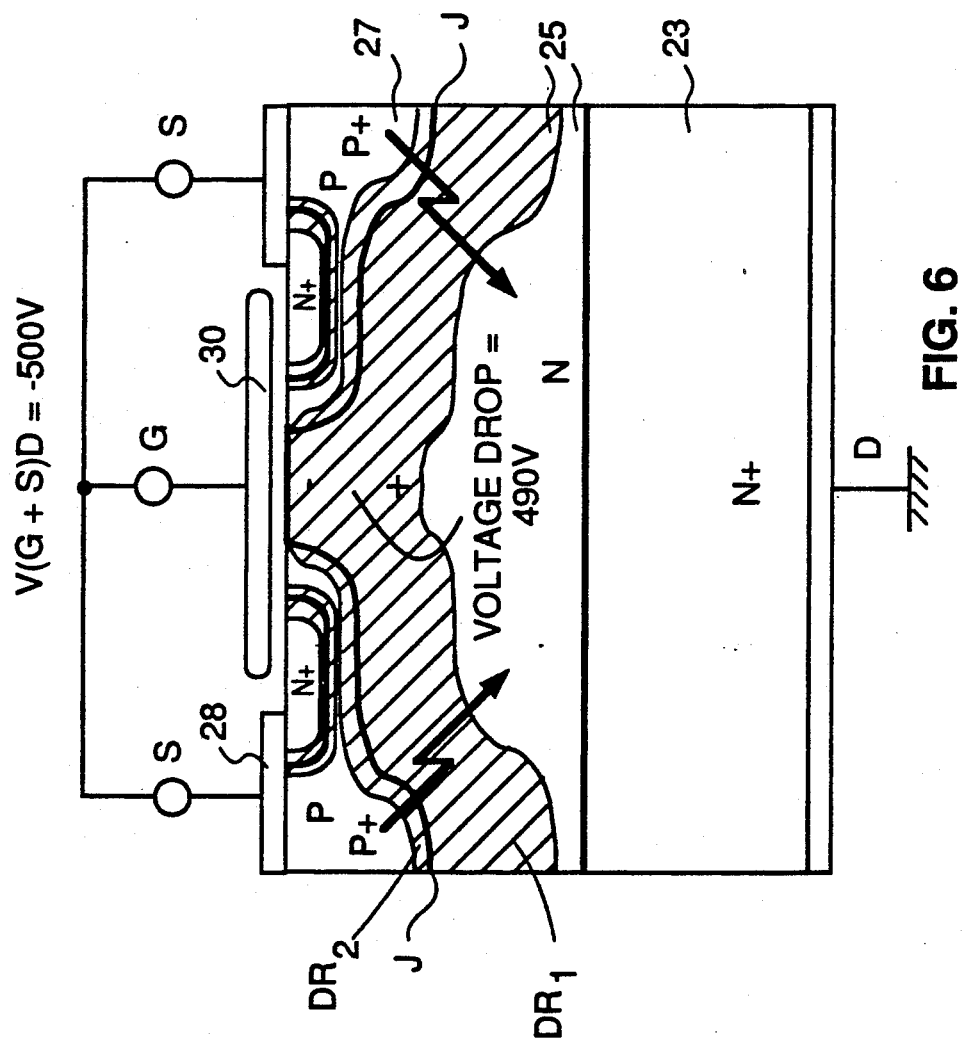
FIG. 6 is a schematic cross-sectional view of a planar DMOS transistor, indicating the depletion region at the point of breakdown initiation.
Figure 7:
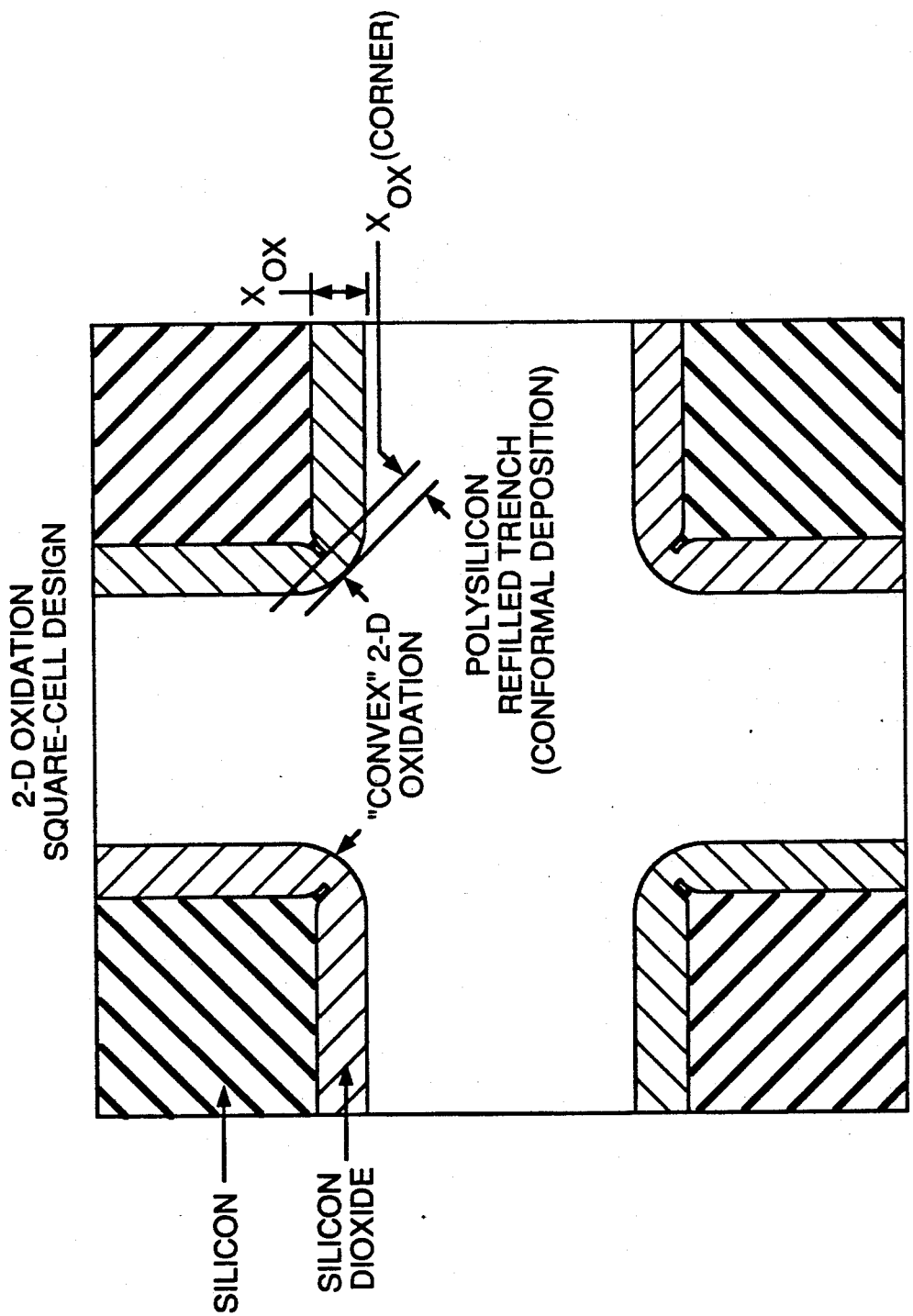
FIG. 7 is a schematic plan view of the oxide covering profile for trench walls with square corners.

FIG. 6 illustrates merging of the depletion regions of two adjacent cells of a planar DMOS transistor, when the gate region 30 and source 28 are set at a common voltage of $-500$ v and the drain region 23 is maintained at 0 volts. The arrows in FIG. 6 indicate paths across the depletion region that may produce avalanche breakdown across the p-n junction formed between the body region 27 and the epi layer 25 in a planar DMOS transistor Typically, breakdown occurs near a curved region of the junction A second problem is oxide dielectric breakdown. In a closed-cell geometry, the trench side wall oxide is grown under nonplanar, two-dimensional conditions at intersections of trench faces This causes nonplanar, viscous deformation and stress in the adjacent gate oxide material According to published theoretical and experimental evidence, the oxide that grows on the side walls of, for example, a square cell DMOS transistor is thinned and distorted at an intersection of two adjacent trench faces in a manner illustrated in FIG. 7. When these distortions are combined with conformal covering of the surface of gate material, the oxide profile may develop near-atomically sharp field concentration sites and may manifest premature dielectric breakdown.

This problem can be managed and eliminated to some extent by growing and etching away a "sacrificial oxide layer" before the gate oxide is grown on the trench walls, as analyzed by Yamabe and Imai, cited above. This sacrificial oxidation rounds off the sharp corners of the initial trench profile. This improvement is obtained at the cost of using an additional thermal cycle, during which time an initially shallow impurity profile will diffuse vertically and laterally into the adjacent semiconductor material.

A third problem is the development of clusters of silicon microcolumns known as "black silicon" during the trench etch process. Black silicon occurs as a result of the presence of materials (such as defect clusters) on the silicon surface that have etch rates lower than that of the silicon itself; these materials act as micromasks that prevent the etching of the silicon microcolumns. These materials may result from either an incomplete removal of an oxide trench mask, or they may be deposited on the surface during the trench etch process. The probability of obtaining black silicon has been observed to increase with an increase in the area of exposed silicon and to increase where the silicon area is not closely surrounded by reflecting walls, for example at the intersection of two trench faces This may result from variations in efficiency of sputter etching of the micromasking materials.

Figure 8:
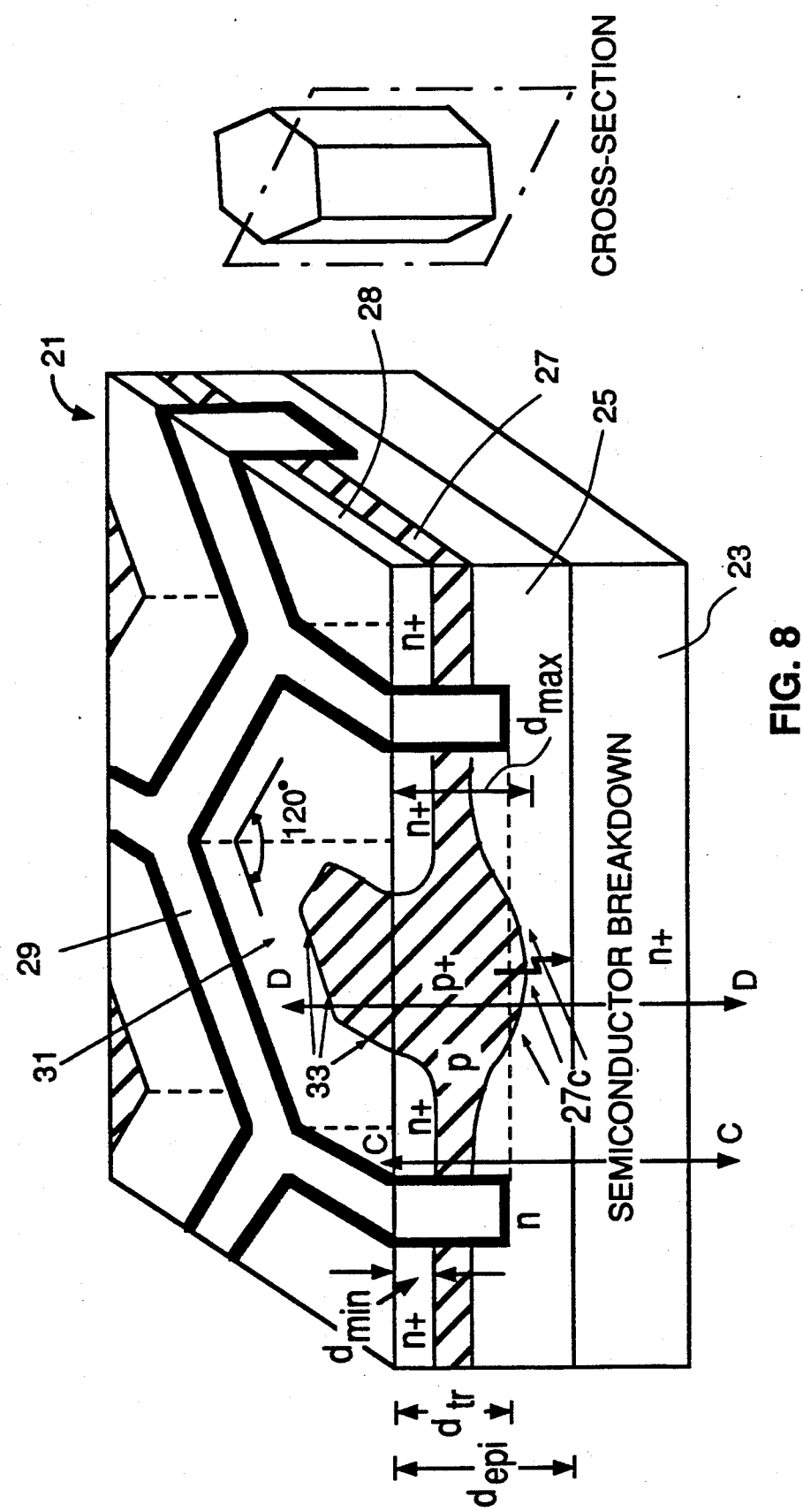
FIG. 8 is a schematic cross-sectional view of one embodiment of the invention.

FIG. 8 illustrates one embodiment of the invention, showing half of a hexagonally shaped trench DMOS structure 21. The structure includes, in this embodiment, an n+ substrate 23, on which is grown a lightly doped epitaxial layer (n) 25 of a predetermined depth $d_{epi}$. Within the epi layer 25, a body region 27 of opposite conductivity (p, p+) is provided. Except in a certain central region that will be discussed shortly, the p body region is substantially planar and lies a distance $d_{min}$ below the top surface of the epi layer 27. Another covering layer 28 (n+) overlying most of the body region 25 serves as source. A hexagonally shaped trench 29 is provided in the epitaxial layer, opening toward the top and having a predetermined depth $d_{tr}$. The trench 29 associated with a transistor cell defines a cell region 31 that is also hexagonally shaped in horizontal cross-section. Within the cell region 31, the body region rises to the top surface of the epi layer 25 and forms an exposed pattern 33 in a horizontal cross section at the top surface of the cell region. This central exposed portion of the body region is more heavily doped (p+) than the substantially planar remainder of the body region. Further, this central portion of the body region extends to a depth $d_{max}$, below the surface of the epi layer 25, that is greater than the trench depth $d_{tr}$ for the transistor cell. The distance from the deepest part of the (p+) body region to the substrate-epi layer junction is less than the depletion width of a planar p+/n junction that has the same doping profile and is reverse biased around its breakdown voltage. That is, a central portion 27c of the body region lies below a plane that is defined by the bottom of the trench 29 for the transistor cell. The transistor cell 21 need not have a hexagonal shape for basic transistor operation; any polygonal shape will suffice, but a regular rectangular shape and a regular hexagonal shape are the most convenient for layout purposes as these shapes allow a regular tessellation of the plane. A triangular shape, although it also allows a tessellation of the plane, is not attractive as the sharp trench corners for a triangular-shaped cell are undesirable.

The embodiment of the invention illustrated in FIG. 8 has several important features: (1) a horizontal section of the transistor cell shows a hexagonally shaped trench, used to suppress oxide dielectric breakdown and for other beneficial purposes; (2) the trench vertical depth is less than the depth of the deepest part of the body region, to force voltage breakdown away from the trench surfaces and into the bulk of the semiconductor material; and (3) the intersection of adjacent trench "legs" forms a triangular region with reduced area, for purposes of diminishing the growth of black silicon columns. As noted, a deep body diffusion is included in the center of the transistor cell 21 where the body contact is to be made. This diffusion is deeper than the trench depth by an amount that depends upon gate oxide thickness and upon epitaxial silicon resistivity so that the semiconductor breakdown is forced away from any trench surface or corner and into the bulk of the semiconductor material, namely inside the field-constricted region created by the deep body junction and the adjacent substrate ("reach-through bulk breakdown"). Using this diffusion profile, the breakdown voltage of the transistor is relatively stable and hot carrier injection is suppressed. Moreover, avalanche breakdown occurs below the body contact, not laterally along the contact, and lateral voltage drop through the body region, which would lead to bipolar breakdown, is avoided. The reverse breakdown I-V characteristic of the transistor cell has an abrupt or "hard" appearance because it is determined by bulk breakdown, and it takes place relatively uniformly in the active area. The transistor cell is free of high current concentration (avalanche) and is free of bipolar breakdown and can thus carry reverse avalanche currents that are comparable in magnitude to the forward current; this may be useful in some applications.

Figure 9:
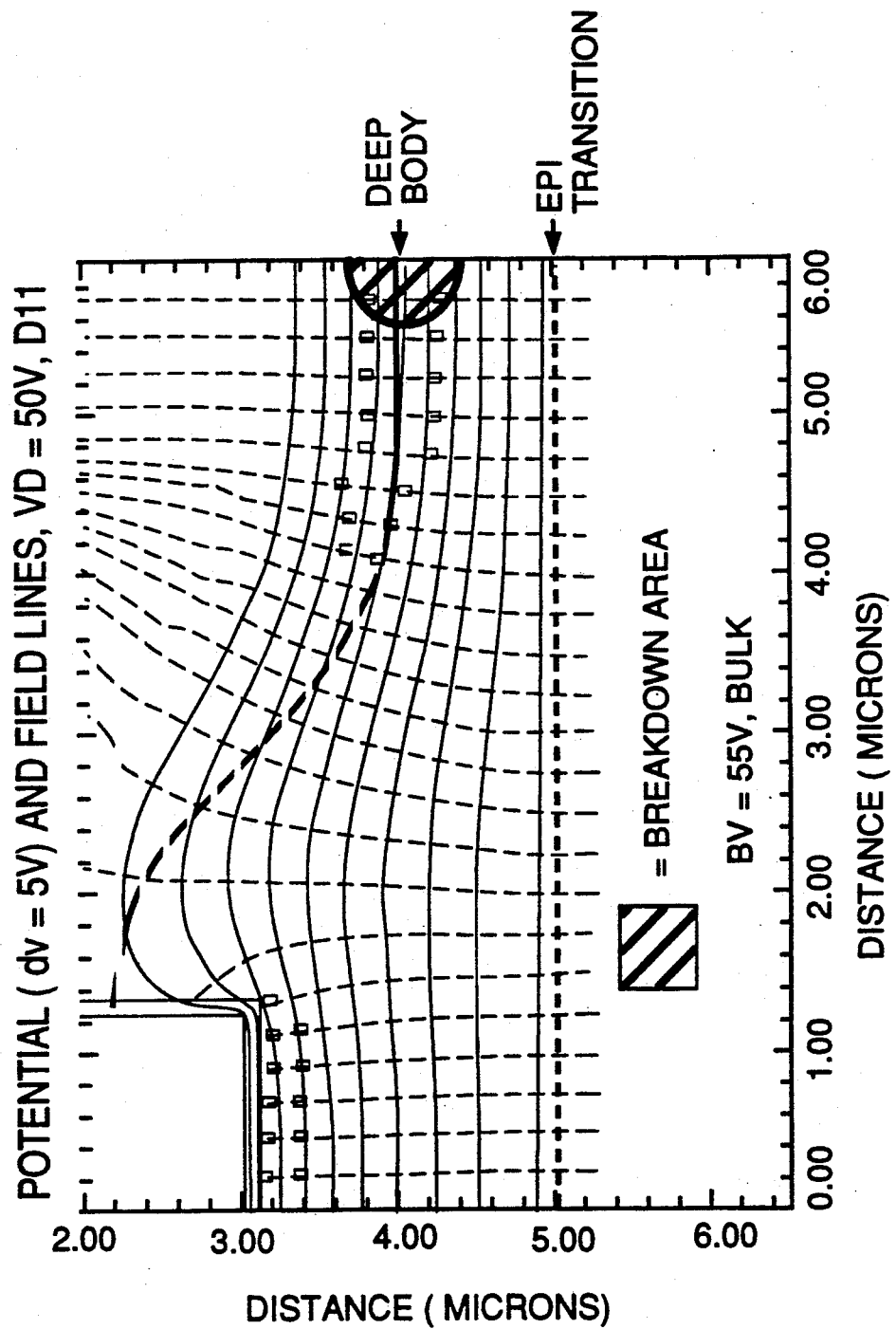
FIG. 9 is a graphic illustration of the results of a computer simulation of the electrical field lines in a trenched DMOS transistor where the deep body junction lies at a greater depth than does the bottom of the trench.

FIG. 9 shows the results of a computer simulation of BVDSS operation of a trenched DMOS transistor constructed according to the invention, where the deepest part of the deep body region lies below the bottom of the trench. The field structure illustrated in FIG. 9 reveals bulk semiconductor breakdown, as desired This should be compared to the structure illustrated in FIG. 5 in which the deepest part of the body region lies above the bottom of the trench and in which surface breakdown prevails In a horizontal cross-section, the trench side walls intersect at angles of approximately 120°, as compared to an intersection angle of 90° in a rectangular cell design. This offers a substantial improvement for two-dimensional oxidation conditions as it reduces stress at the corners and promotes increased uniformity of oxide thickness. Further, the hexagon corners may become rounded off during the trench mask lithography and etching processes that precede trench formation so that the DMOS cells approach the cylindrical shape of a natural, field-controlled current valve. A hexagonal cell, trench DMOS is expected to have a higher gate rupture breakdown voltage than does its rectangular cell counterpart For transistor operation the trench shape, in horizontal cross section (plan view), may be a polygon (not necessarily regular) or a circle or an oval; but the regular hexagon and polygonal shapes approaching a circle are the preferred shapes from the point of view of maximizing the gate oxide rupture voltage.

Figure 10:
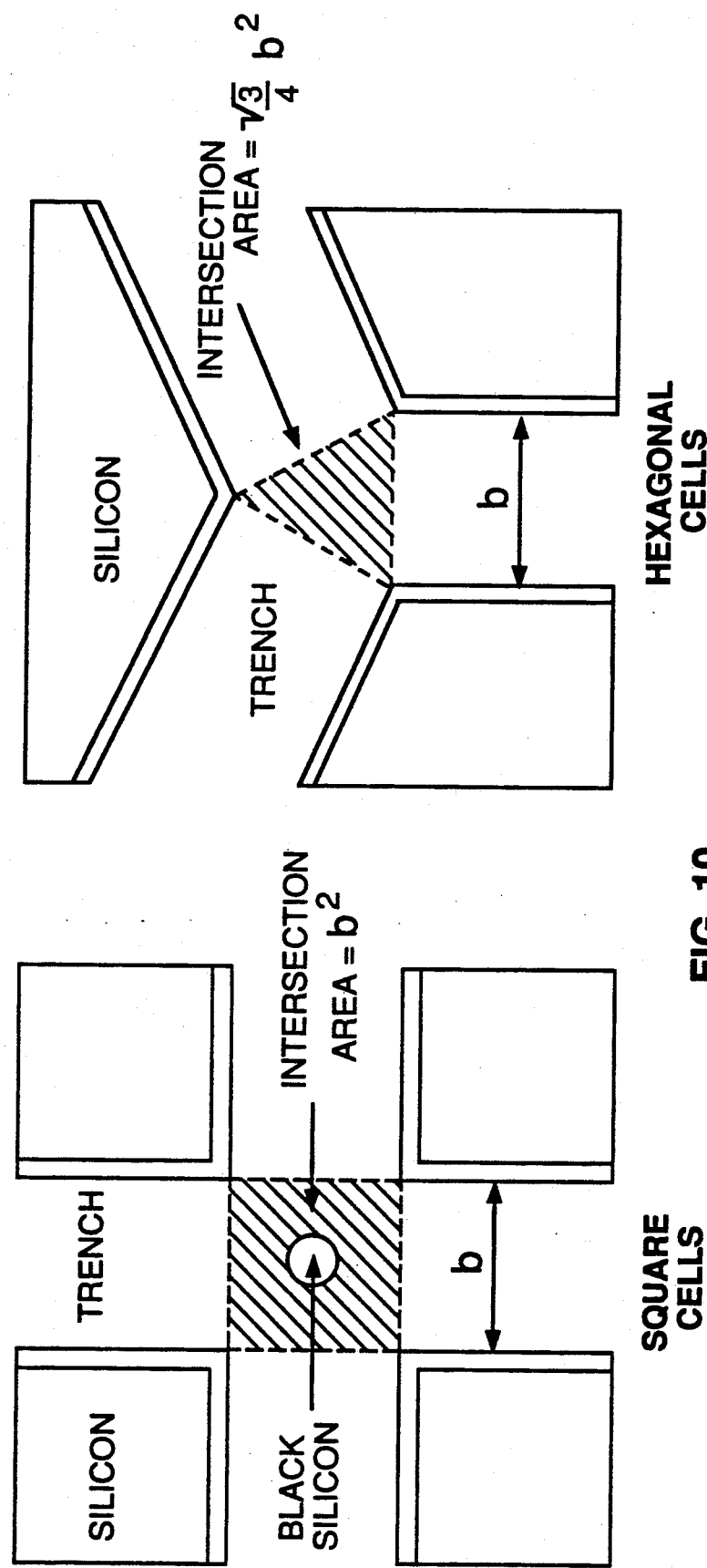
FIG. 10 compares the areas of intersection of intersecting trench legs, for a square-cell design and a hexagonal-cell design.

With reference to FIG. 10, the open area at the trench intersection for a rectangular design is $b^2$, where b is the trench width By contrast, for the hexagonally shaped trench design, the open area at a trench intersection is $\sqrt{3}b^2/4 = 0.43b^2$, a reduction by more than 50% in the corresponding open area relative to the conventional rectangular design As noted earlier, the probability of formation of black silicon columns increases as the open area at trench intersections increases, so that a hexagonally-shaped trench will be less susceptible to the black silicon problem than its rectangular cell counterpart Further, one can show that the hexagonal shaped cell design has the same Z/A figure of merit as does a square cell design with the same cell opening, a, and the same trench width, b. The Z/A parameter for each of these cells is $$\frac{Z}{A} = \frac{4a}{(a+b)^2}$$

Thus, the linear region on-resistance of a hexagonal cell, trench DMOS transistor is neither superior to nor inferior to the corresponding square cell transistor that occupies the same silicon area.

Figure 11:
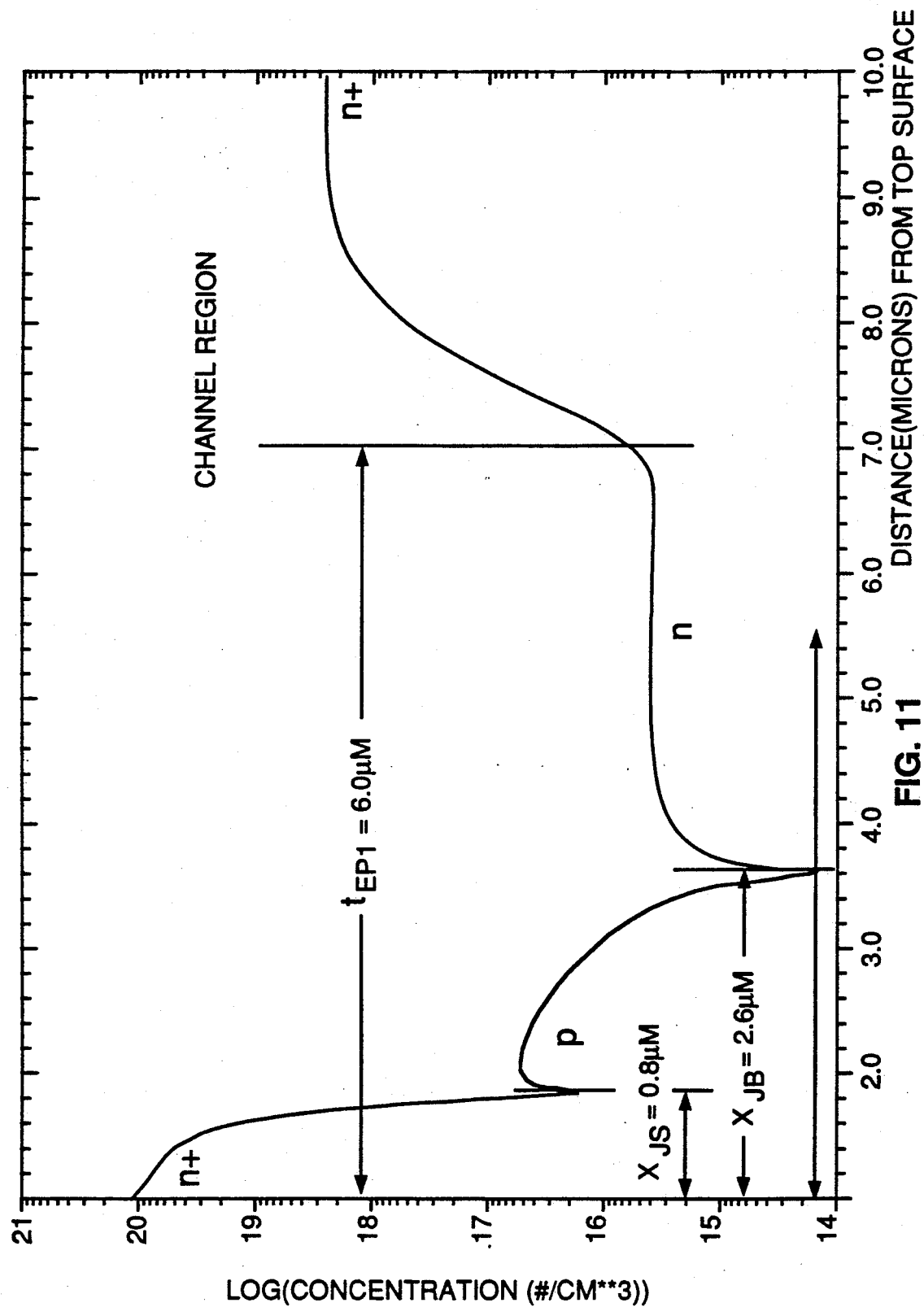
FIGS. 11 and 12 are graphical views of the doping concentrations at various depths below the top surface of the transistor cell shown in FIG. 8, in the channel region indicated by the line CC and in a deep body region indicated by the line DD, respectively.

FIG. 11 illustrates graphically the approximate doping concentration taken along a cross-section line CC that is adjacent to a trench 29, as indicated in FIG. 8. Distance, shown in microns along the abscissa of FIG. 11, is measured from the top surface of the cell. Beginning at the top surface and moving down, the first layer is an n+source region 28 with a maximum n type doping concentration (at the surface) of approximately $10^{20}$ cm$^{-3}$; this extends to a depth of approximately 1 μm. The next dopant layer encountered is a p type body region 27, having a maximum concentration of approximately $7 \times 10^{16}$ and decreasing as the distance from the top surface increases; the body region 27 extends from a first junction (source-body) at approximately 1 μm depth to a second junction (body-epi layer) at approximately 2.7 μm depth. The next layer encountered is an n type epitaxial layer 25 having an approximately constant doping concentration of about $5 \times 10^{15}$ cm$^{-3}$ and extending from the second junction point at 2.7 μm depth to a transition region that is located at a depth of 6 μm. An n+ drain region 23 lies below and is contiguous to the epitaxial layer 25; doping concentration in the n+ drain region 23 increases from about $5 \times 10^{15}$ cm$^{-3}$ to a maximum value of approximately $5 \times 10^{18}$ cm$^{-3}$ as the depth increases.

Figure 12:
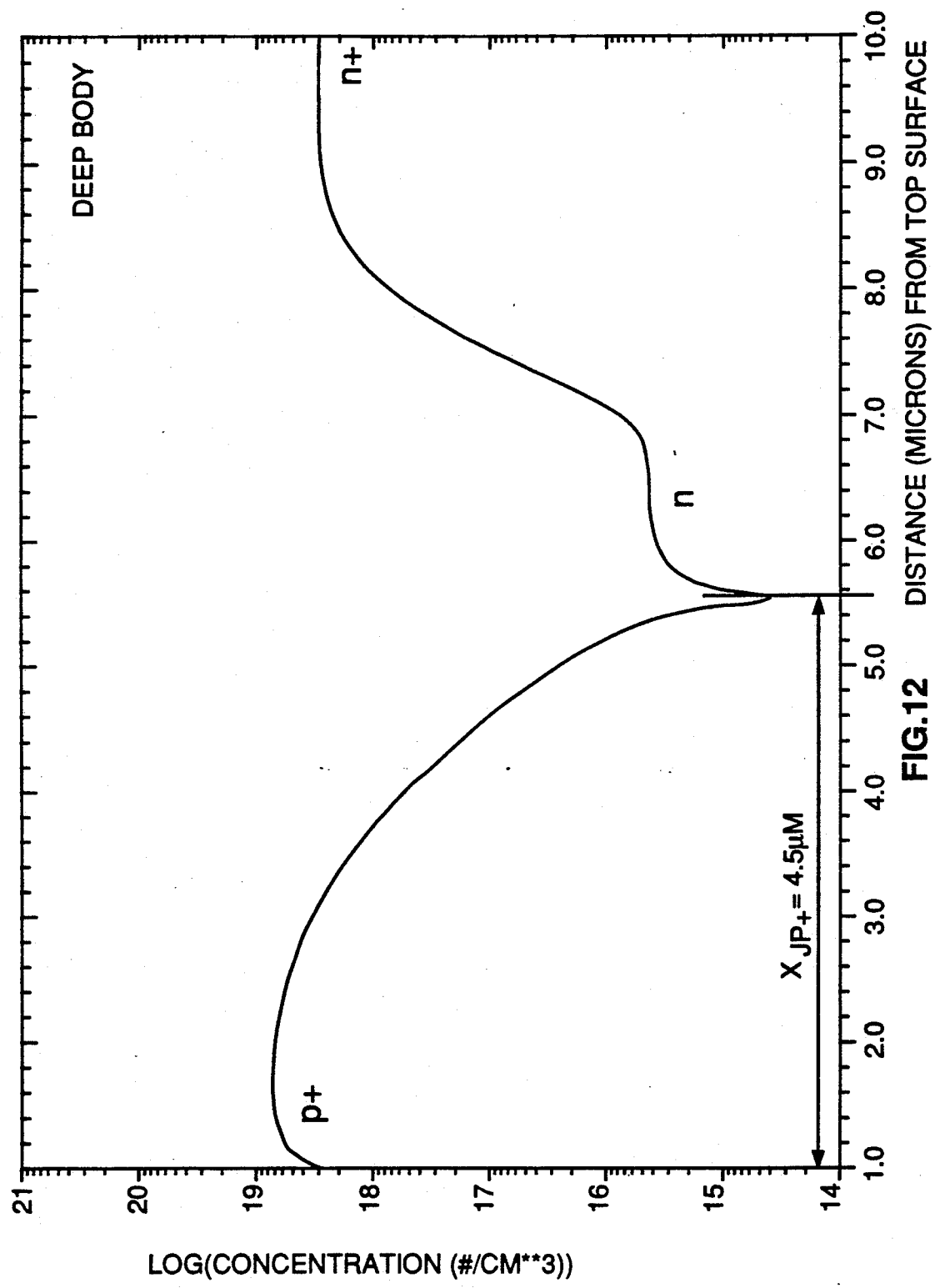

FIG. 12 exhibits the doping concentration along a deep body line DD shown in FIG. 8. At the top surface, a heavily-doped p type body region 28 of maximum concentration approximately $7 \times 10^{19}$ cm$^{-3}$ (at the top surface) is present and extends from the top surface to a depth of approximately 4.5 μm. An n type epitaxial layer of doping concentration substantially $5 \times 10^{15}$ cm$^{-3}$ extends from a first junction at 4.5 μm to a transition region at approximately 6 μm. Beyond a depth of 6 μm, the heavily doped n+ drain, having maximum concentration of substantially $5 \times 10^{18}$ cm$^{-3}$ is positioned contiguous to the n type epitaxial layer. All dopant profile data in FIGS. 11 and 12 here refer to a low voltage (−60 volts breakdown) trench DMOS transistor.

The absolute depth of the p+ deep body region 27C (shown as approximately 4.5 μm in FIG. 12) is not of controlling importance for the position of initial breakdown in the transistor cell. The important parameters are (1) the difference between the p+ region depth (called simply "junction depth" here) and the trench depth, (2) the difference between the depth of the bottom surface of the epitaxial layer 25 and the bottom of the p+ deep body region 27c (shown as approximately 1.5 μm in FIG. 12) and (3) the gate oxide thickness.

We have performed extensive simulations to identify the initial point of voltage breakdown in a transistor cell of the configuration illustrated in FIG. 8, using the PISCES program available from Technology Modeling Associates, Palo Alto, Calif. Avalanche breakdown occurs by definition at the point, if any, along an electric line ($x_o \leq x' \leq x$) for which the current multiplication integral equals one; that is $$\int_{x_o}^{x} \alpha_n(x') \exp \left[ \int_{x_o}^{x'} [\alpha_p(x'') - \alpha_n(x'')] dx'' \right] dx' = 1, \quad (1)$$

where $\alpha_n(x)$ and $\alpha_p(x)$ are carrier ionization coefficients for electrons and holes, respectively, that depend upon the local electrical field strength E and other variables. Two positions of interest for initiation of avalanche breakdown are (1) a point $P_1$ in the channel region adjacent to a corner of the trench and (2) a point $P_2$ in the bulk of the semiconductor material that is spaced apart by several microns from the trench and channel region. Avalanche breakdown adjacent to the trench is undesirable; avalanche breakdown, if it occurs at all, in the bulk of the material at a position such as $P_2$ is acceptable, for the reasons discussed above.

In our simulations, the n+ source region 28 and the gate region 29 were both held at 0 volts, according to the customary definition of drain breakdown voltage BVDSS. The voltage of the drain region 23 was increased incrementally, beginning at 0 volts (without ionization integral calculation) and from 50 volts upward in one-volt increments (with calculation of the ionization integral value from Eq. (1)), until the avalanche breakdown equation shown above was satisfied at some point along a current flow line. The point for which avalanche breakdown first occurs (i.e., with the lowest drain voltage) is identified as the point of initial avalanche breakdown.

Figure 13:
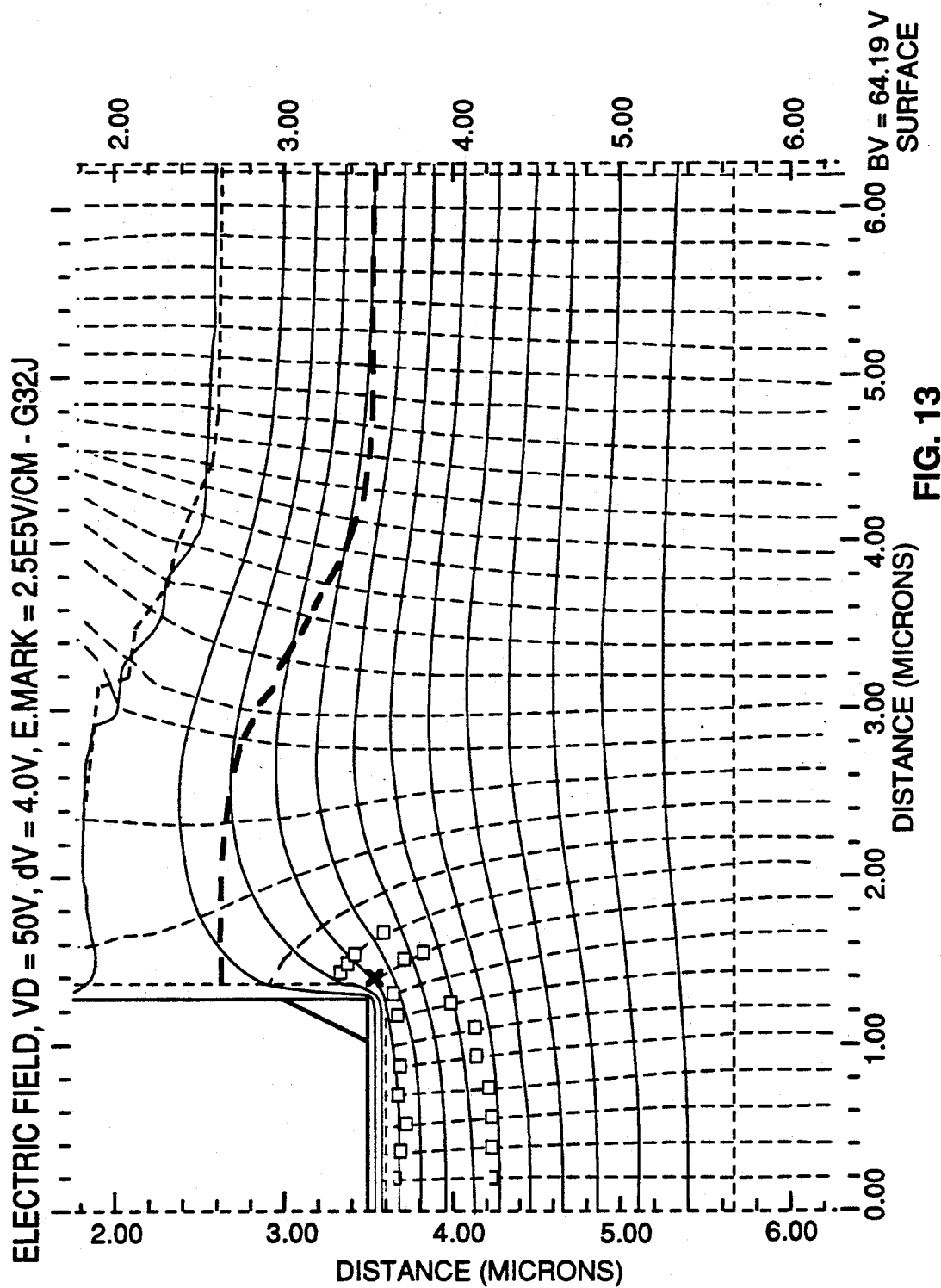
FIGS. 13, 14, and 15 are schematic cross-sectional views illustrating a transistor cell avalanche breakdown adjacent to the trench (FIGS. 13 and 14) and in the bulk material (FIGS. 15), showing the gate oxide thickness and the depths of the trench and epitaxial layer for three choices of p+region depth ("junction depth").
Figure 14:
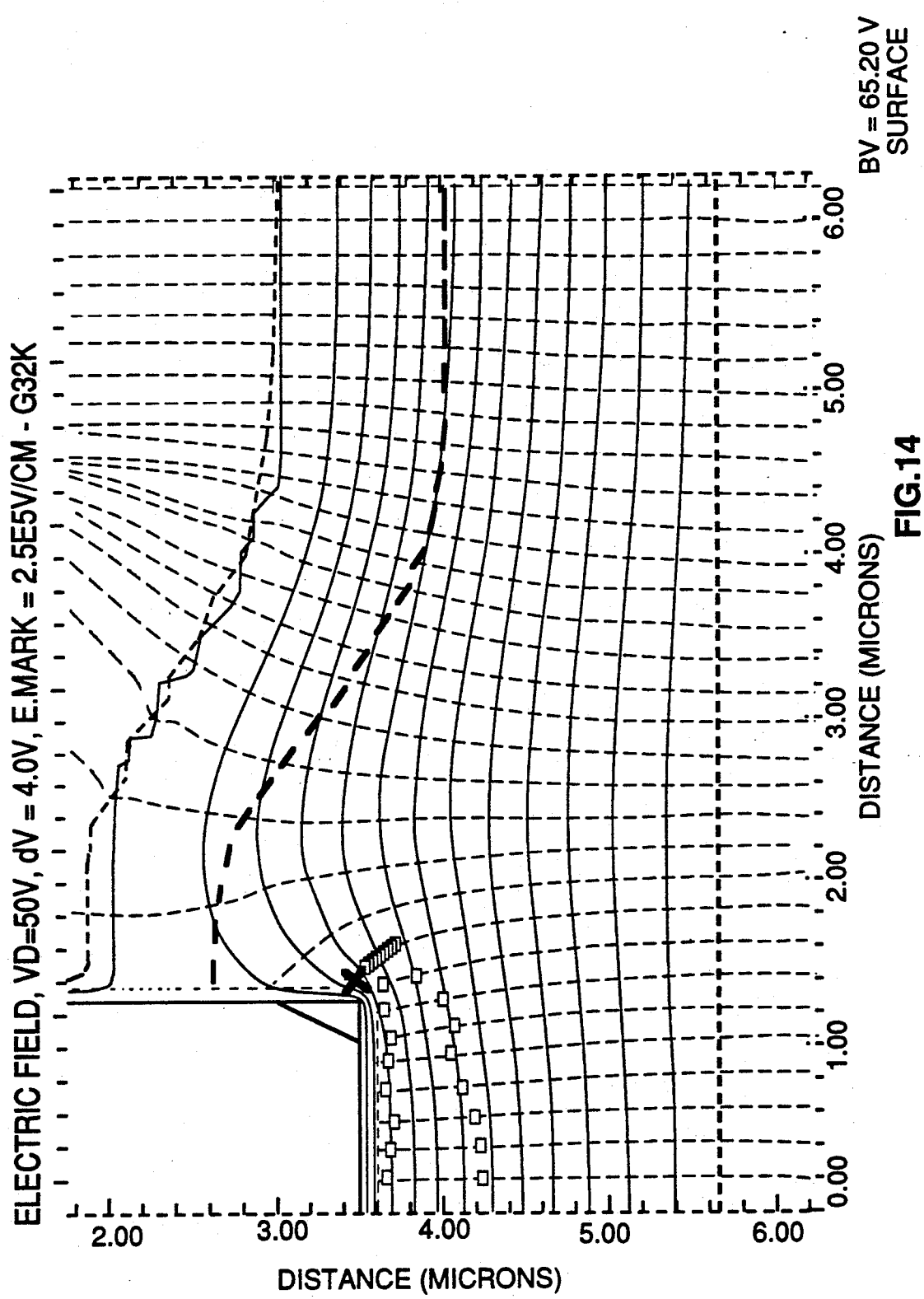
Figure 15:
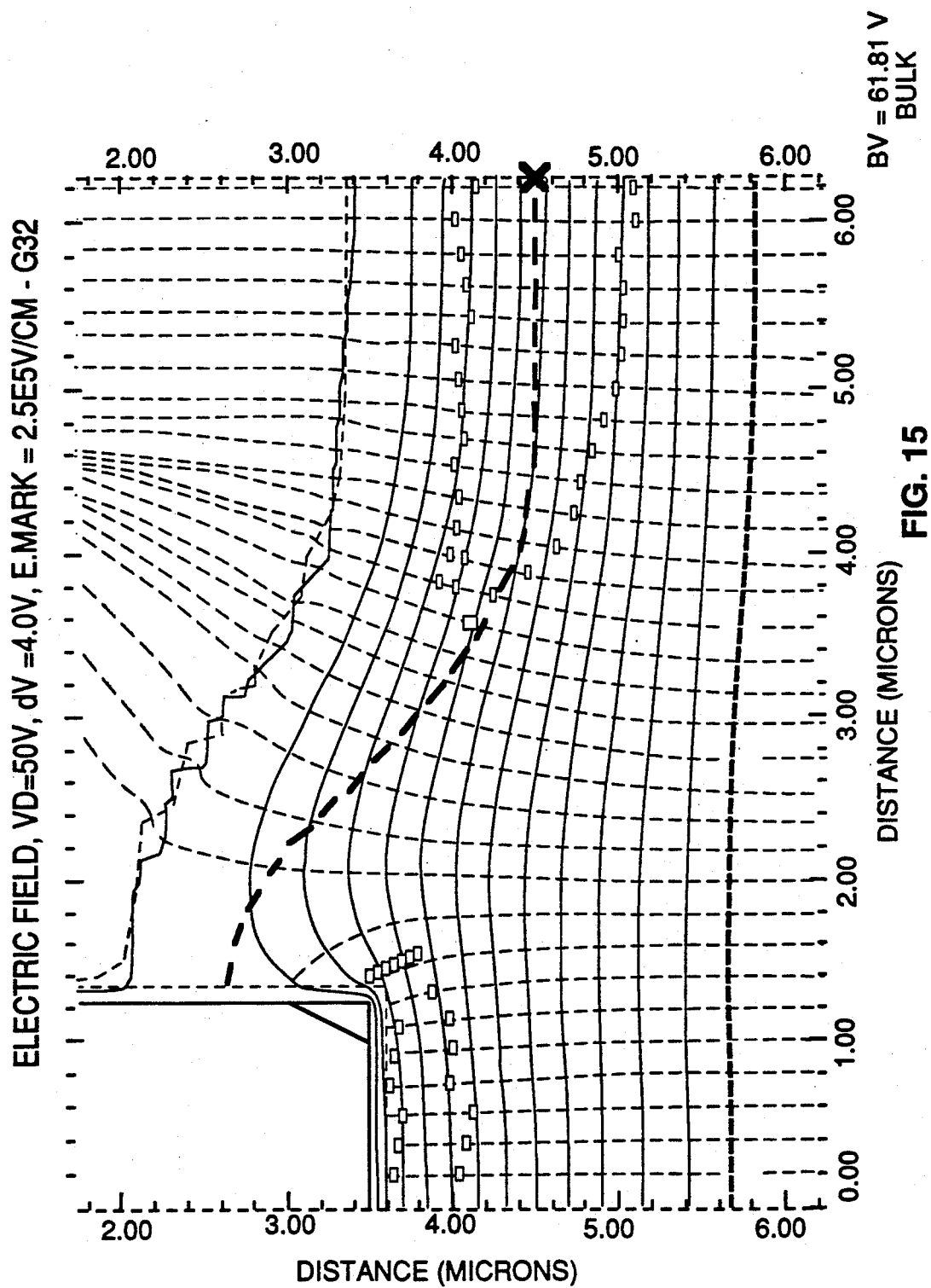

We found, surprisingly, that if initial avalanche breakdown is to occur in the bulk rather than adjacent to a trench corner, it is not sufficient that the junction depth be at least equal to the trench depth; junction depth minus trench depth must exceed a lower bound that is approximately 0.5 μm and may be greater in some situations. This is illustrated in FIGS. 13, 14 and 15. In FIG. 13, the trench depth and the junction depth are approximately equal, each being about 3.5 μm below the top surface of the transistor cell; epitaxial layer thickness, measured from the top surface, is 5.25 μm. In this situation, avalanche breakdown is initiated adjacent to a corner of the trench indicated by an X, when the drain voltage reaches approximately 64.2 volts.

In FIG. 14, trench depth is 3.5 μm and junction depth is 4 μm; epitaxial layer thickness is 5.25 μm. Avalanche breakdown is initiated adjacent to a corner of the trench when the drain voltage reaches approximately 65.2 volts. A slight improvement is breakdown voltage occurs, but avalanche breakdown is still initiated adjacent to a corner of the trench, which is undesirable.

In FIG. 15, the trench depth is 3.5 μm but the junction depth is about 4.5 μm; epitaxial layer thickness is 5.25 μm. Here, avalanche breakdown is initiated in the bulk of the material, at the position marked X, and the associated breakdown voltage is approximately 61.8 volts. In FIGS. 13, 14 and 15, the gate oxide thickness was 0.1 μm.

Another variable of importance here is the difference between junction depth and depth of the bottom surface of the epitaxial layer. Avalanche breakdown at a point in the bulk at the junction is of the nature of a reach-through breakdown across the epitaxial layer. Thus, the epitaxial layer should not be too great or reach-through breakdown across the epitaxial layer may not occur; and initiation of avalanche breakdown in the bulk may become impossible or very difficult, even where the junction depth is much larger than the trench depth.

Figure 16:
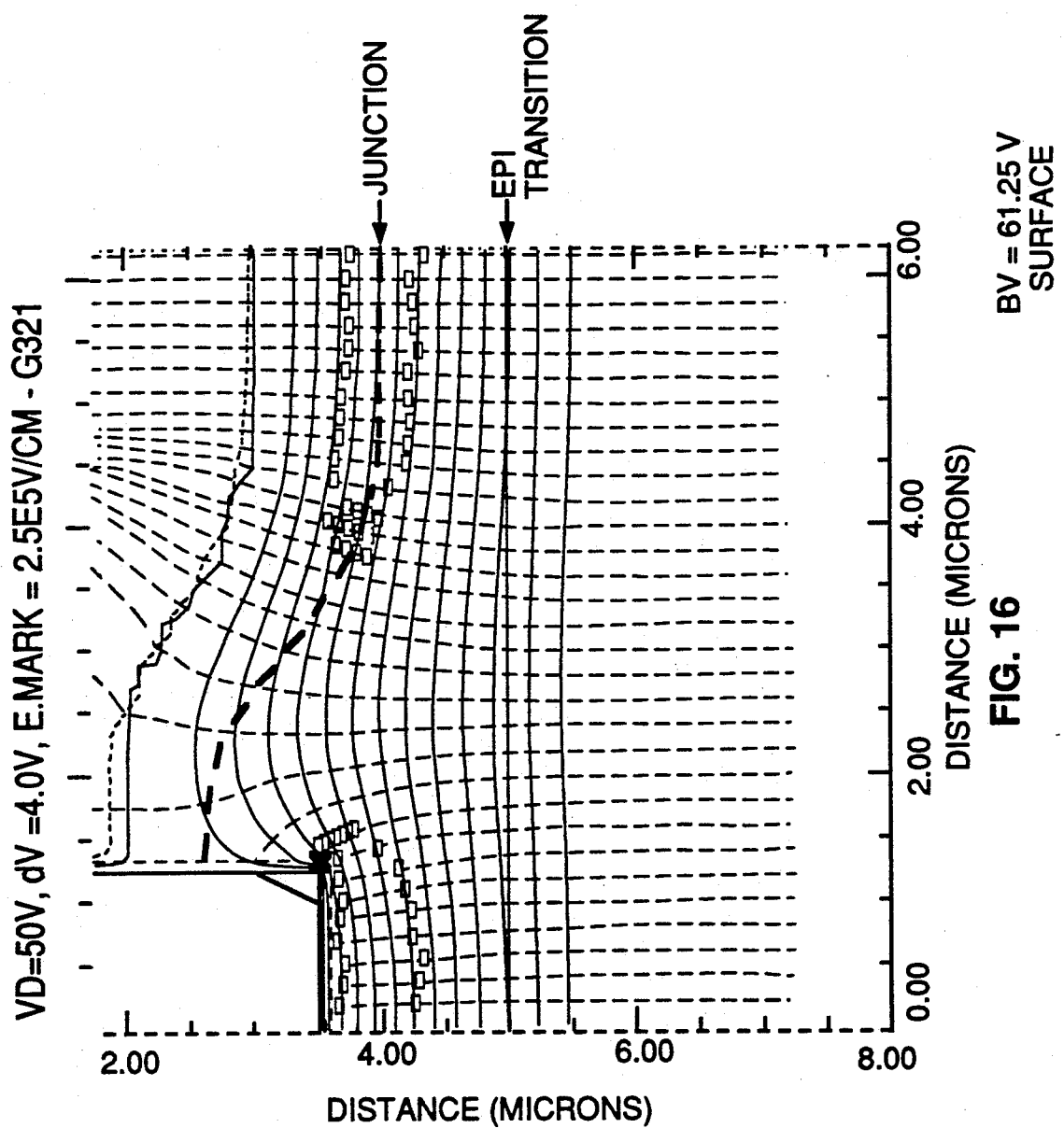
FIGS. 16 and 17 are schematic cross-sectional views illustrating transistor cell avalanche breakdown adjacent to the trench for decreases in epitaxial layer thickness, with all other variables unchanged.
Figure 17:
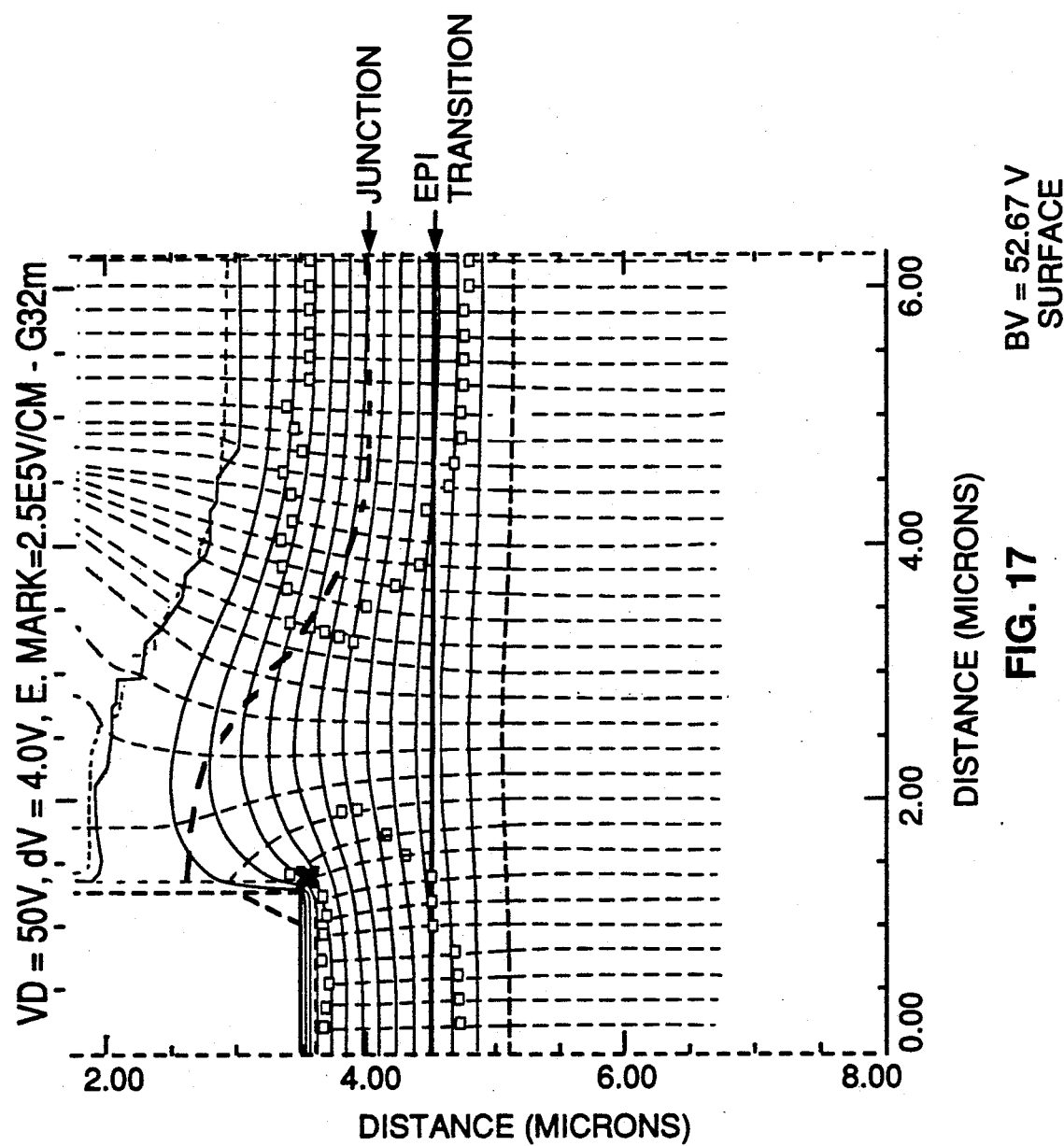

In FIGS. 16 and 17, the gate oxide thickness is 0.10 μm and the epitaxial layer thickness in the region of maximum junction depth is decreased from 5.25 μm in FIG. 14 to 5 μm (FIG. 16) and to 4.5 μm (FIG. 17). Where the junction depth is only 0.50 μm larger than the trench depth, avalanche breakdown is initiated adjacent to a trench corner for epi layer thickness that is decreased to 5.0 μm (FIG. 16) and to 4.5 μm (FIG. 17). The corresponding drain-source breakdown voltages are 61.25 volts (FIG. 16) and 52.7 volts (FIG. 17). As would be expected, drain-source breakdown voltage decreases markedly as the epi layer thickness is decreased.

A third variable of importance here is the thickness of the oxide layer separating the gate material 29 (for example, doped polysilicon) from the surrounding n-type and p-type semiconductor materials. If the gate oxide thickness is increased, the gate oxide can take up a larger portion of the stress associated with the local electrical field, and initiation of avalanche breakdown adjacent to the trench becomes less likely. However, if the gate oxide thickness is increased, the on-state resistance is also increased (undesirable) and the gate voltage has less effect on current flow in the channel region; for this reason, the gate oxide thickness probably should not be increased beyond 0.20 μm. The field-shaping that can be accomplished by increasing the oxide thickness becomes more efficient as the breakdown voltage specified for the transistor increases; in higher-voltage transistors, the channel resistance makes a proportionately smaller contribution to total on-resistance.

Figure 18:
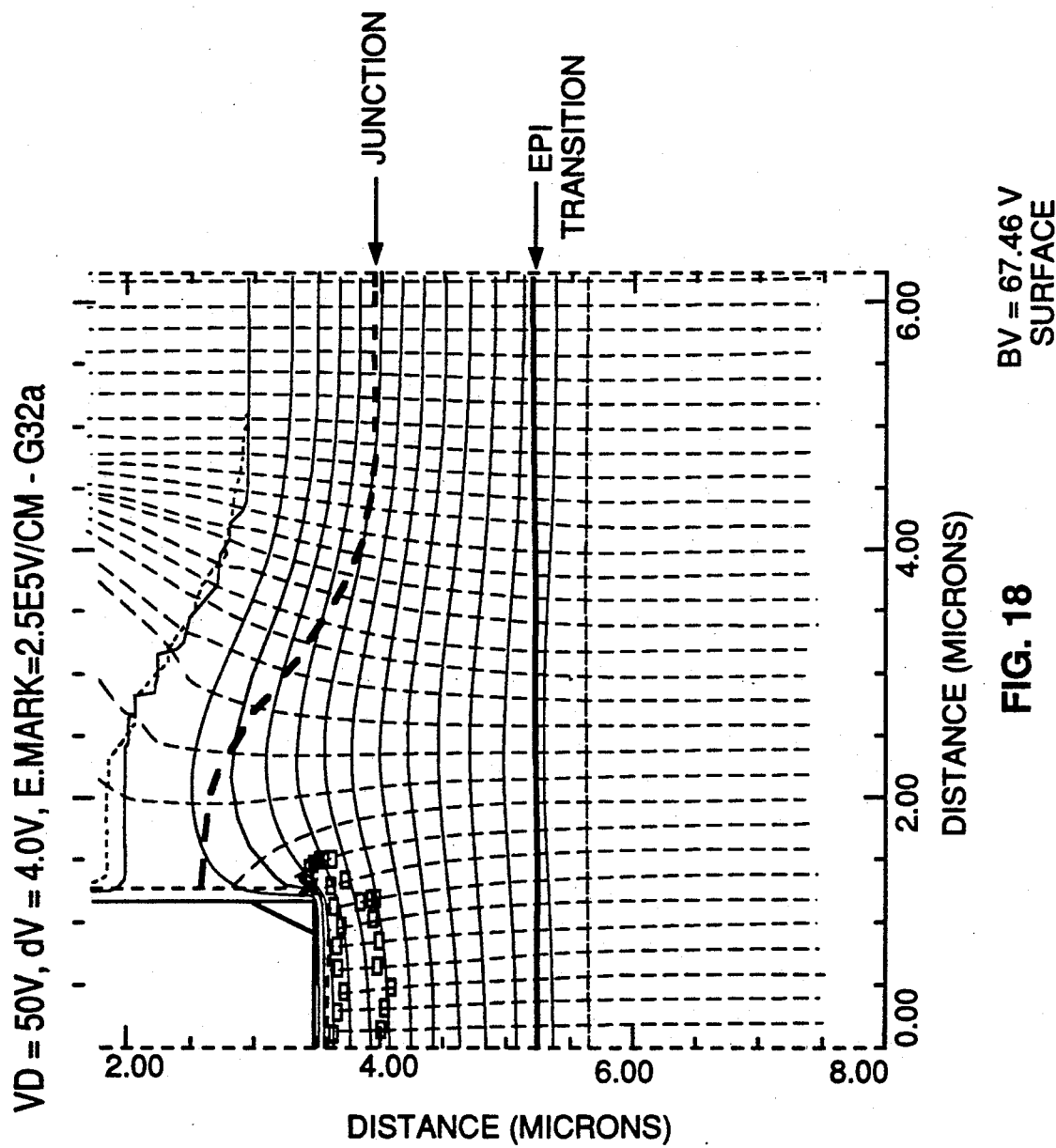
FIGS. 18, 19 and 20 are schematic cross-sectional views illustrating transistor cell avalanche breakdown adjacent to the trench (FIGS. 18 and 19) and in the bulk of the material (FIG. 20), for increasing gate oxide thickness.
Figure 19:
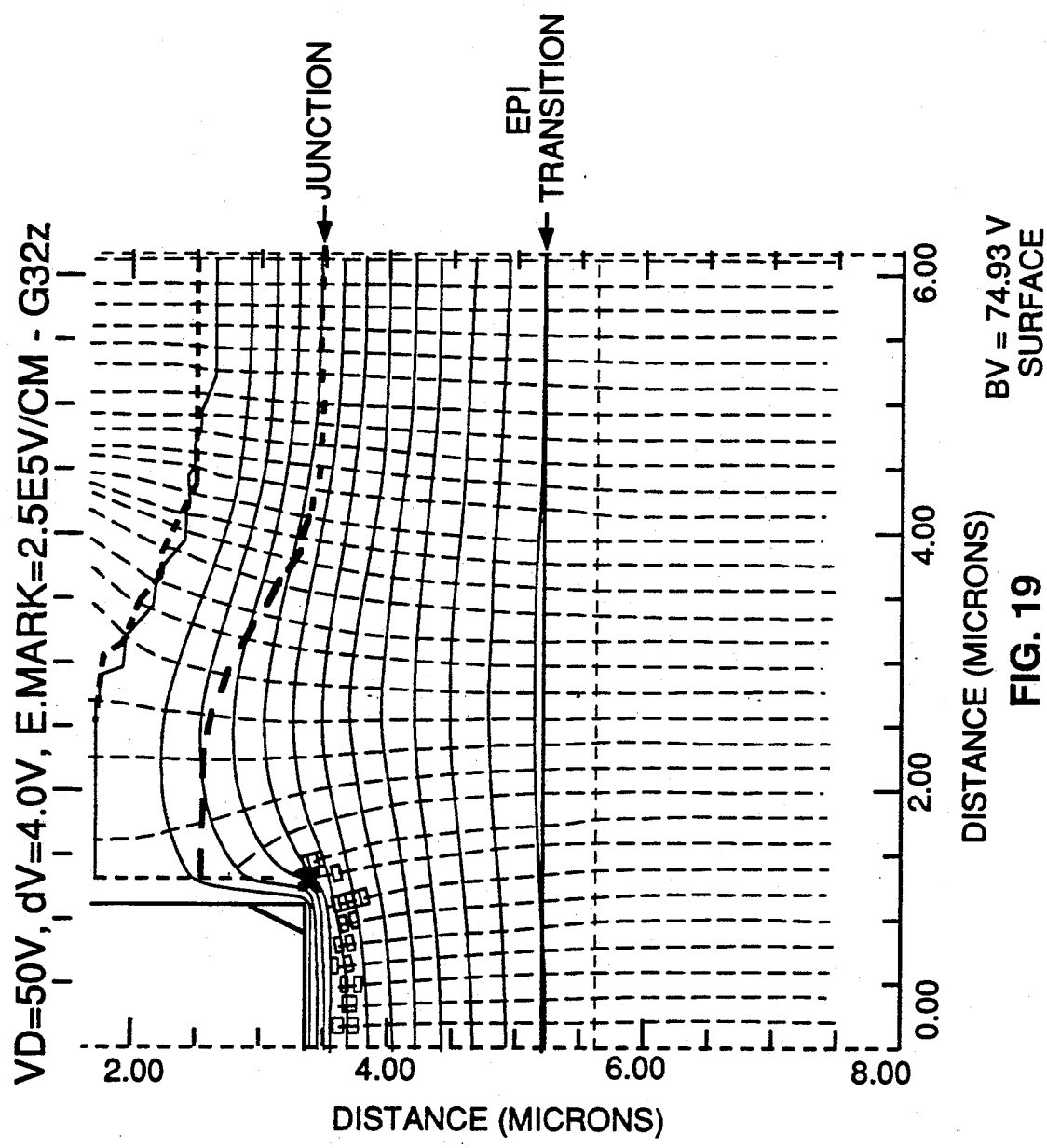
Figure 20:
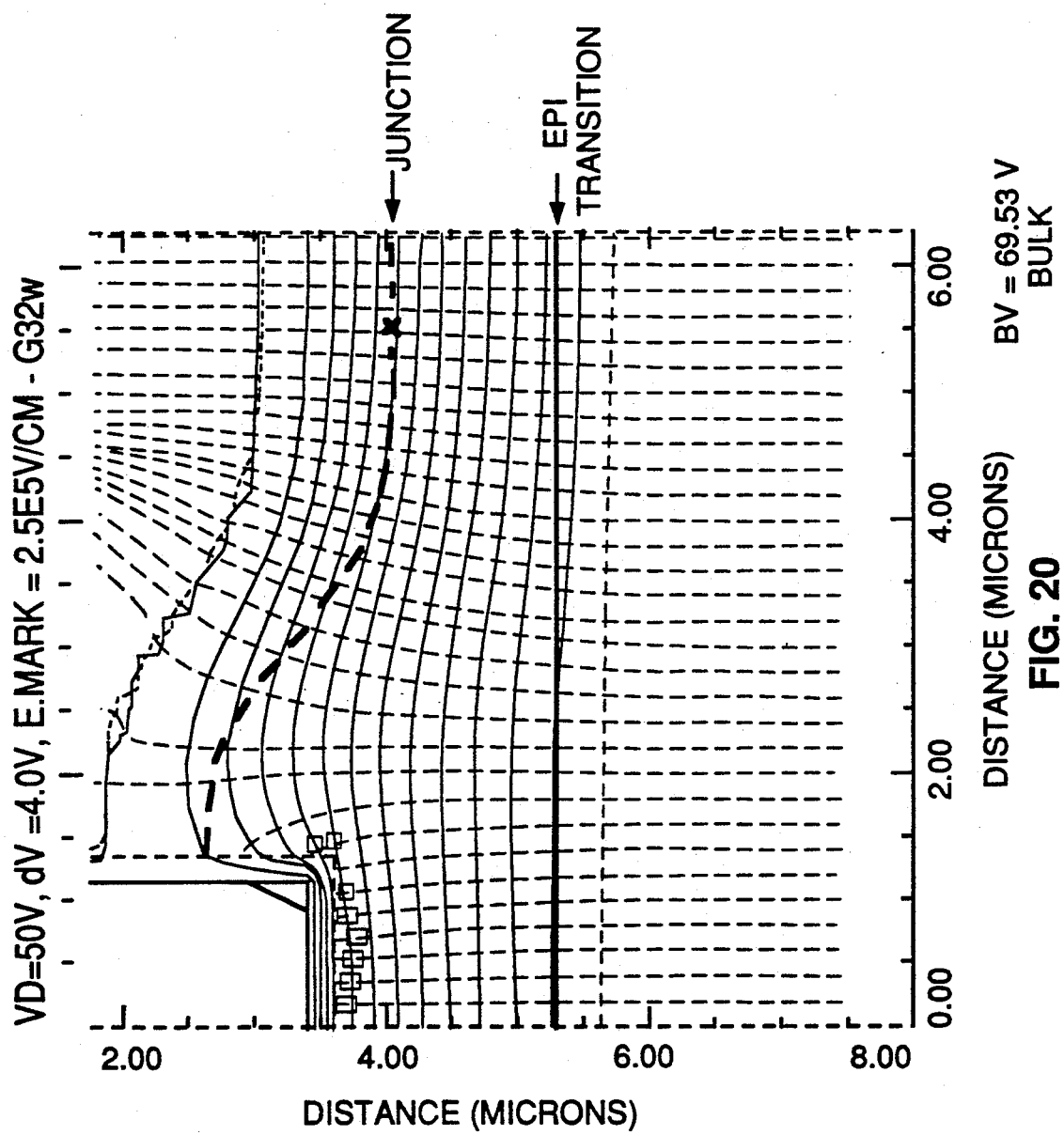

FIGS. 18 and 19 illustrate the effect of increasing the gate oxide thickness $t_{ox}$, originally set at 0.10 μm, on the initiation of avalanche breakdown. In each of FIGS. 18 and 19, the trench depth is 3.5 μm and the junction depth is 4 μm. As noted above in the discussion of FIG. 14, with $t_{ox}=0.1$ μm, avalanche breakdown is initiated adjacent to a corner of the trench, when the drain source voltage reaches 65.2 volts. When the gate oxide thickness is increased to $t_{ox}=0.14$ μm (FIG. 18), avalanche breakdown is still initiated adjacent to the trench corner and the drain-source voltage at breakdown is 67.5 volts. With the oxide thickness increased to $t_{ox}=0.20$ μm (FIG. 19), avalanche breakdown is initiated in the bulk, adjacent to a point on the deep body-epitaxial layer junction that is spaced apart from the trench, and the drain-source voltage at breakdown is increased to 69.6 volts. Where a gate oxide thickness of $t_{ox}=0.20$ μm is used, the on-state resistance of the channel region is increased to possibly-unacceptable values in low-voltage transistors. However, gate oxide thickness is a control variable for positioning of the initial point of avalanche breakdown and for control of the associated breakdown voltage: Ceteris paribus, as $t_{ox}$ increases, the drain-source breakdown voltage increases and the point of initial avalanche breakdown tends to move away from the trench and into the bulk material, as desired. FIG. 20 illustrates the point of initiation of avalanche $t_{ox}=0.20$ μm: The point of initiation of avalanche breakdown remains adjacent to a trench corner, even for a relatively large gate oxide thickness.

FIGS. 13-20 illustrate the control of the point of initiation of avalanche breakdown based upon parameters such as (1) the difference between (maximum) junction depth and trench depth, (2) thickness at the deepest part of the junction of the epitaxial layer and (3) gate oxide thickness. The numbers used in FIGS. 13-20 are representative of the situations discussed in connection with these figures. The values of the parameters themselves will vary with the magnitude of doping concentrations in the semiconductor materials as well as with other semiconductor parameters. The field shaping technique described herein is also applicable to open-cell or stripe geometry transistors that have deep body regions positioned between adjacent trenches.

(B) PROCESS DESCRIPTION

Figure 21:
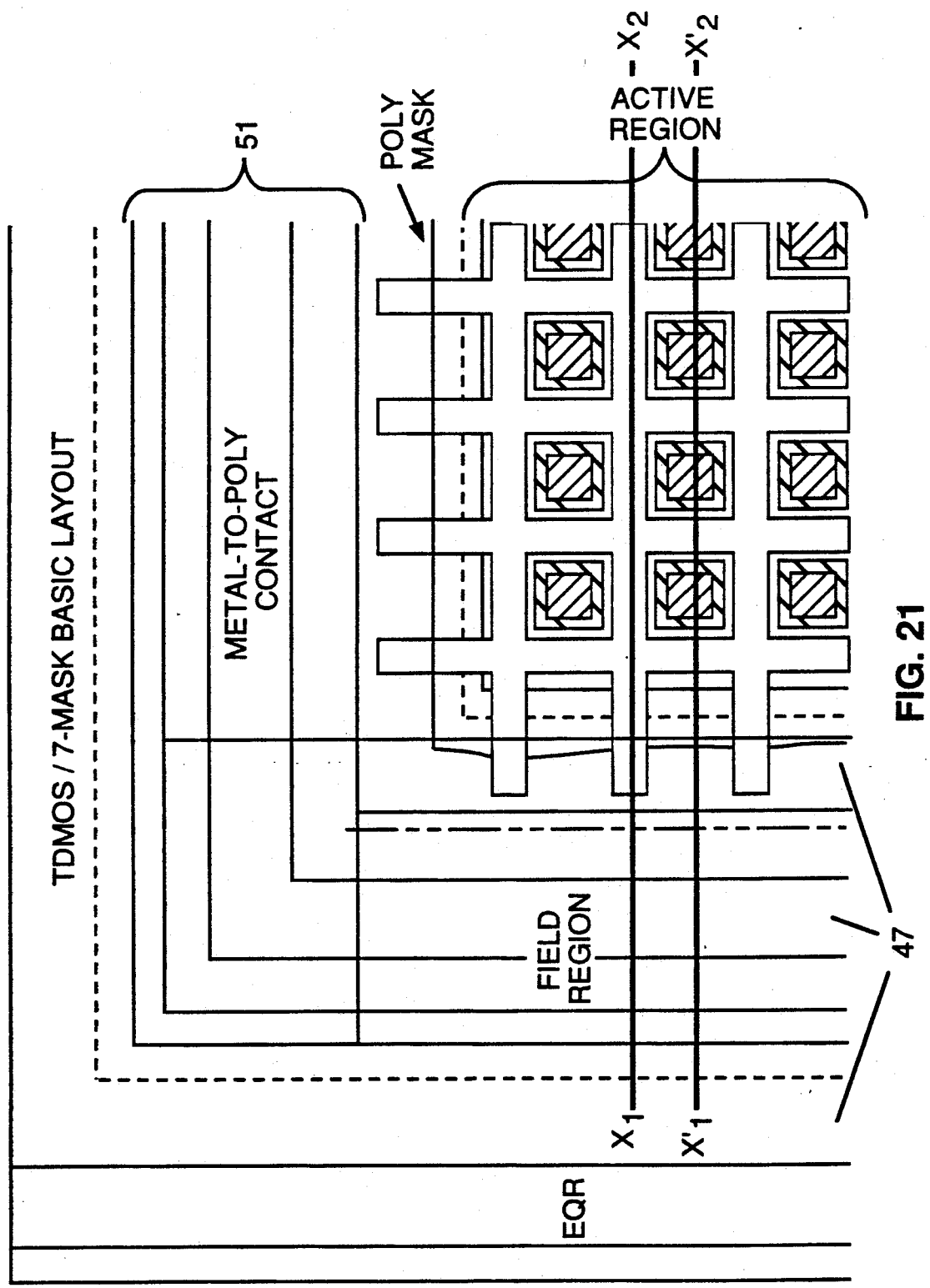
FIG. 21 is a schematic plan view of a group of transistor cells (square-cell geometry, for illustrative convenience), indicating the positions $X_1X_2$ and $X_1'X_2'$ of two planes for which cross-sectional views are provided in FIGS. 22A through 31B.
Figure 22A:
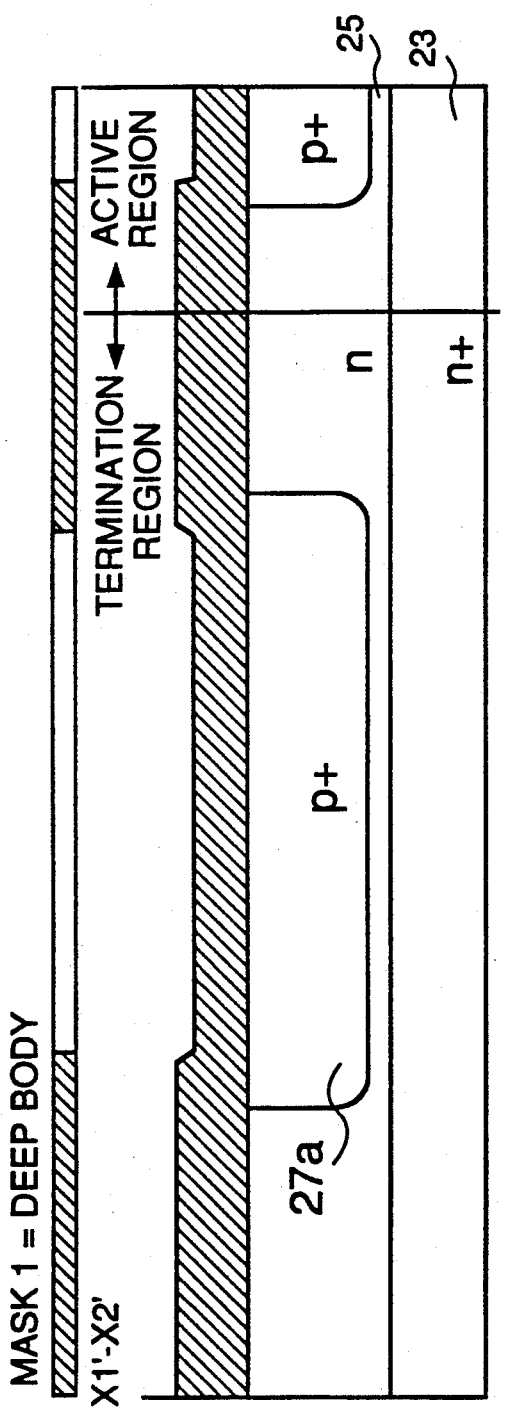
Figure 22B:
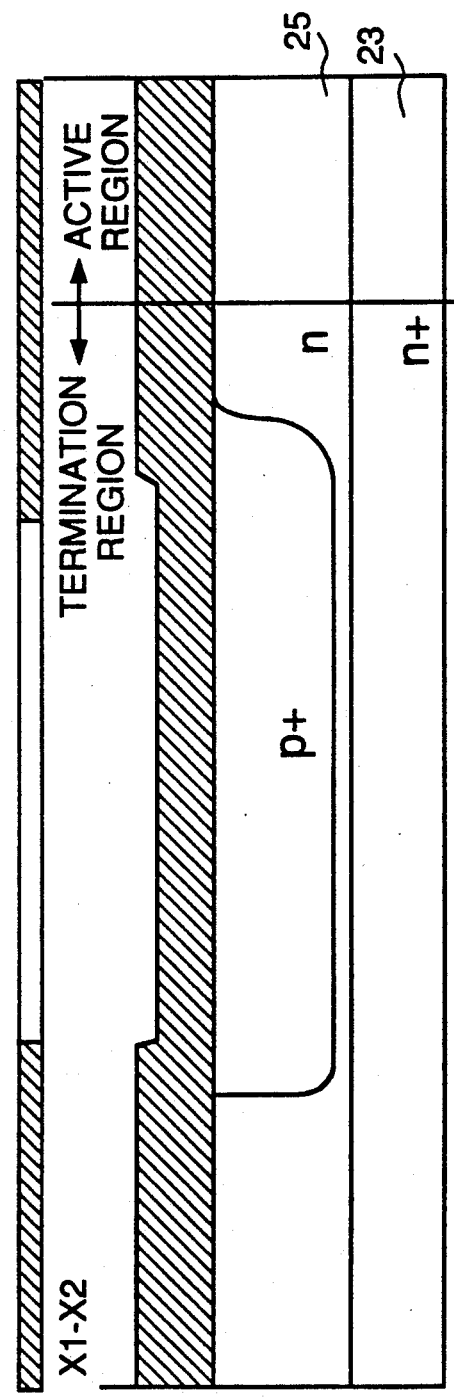

FIGS. 22A and 22B are schematic cross-sectional views of a transistor cell shown in plan view in FIG. 21, where the cross-sectional views are taken with respect to planes indicated by the lines $X_1X_2$ (FIG. 22A) and $X_1'X_2'$ (FIG. 22B) for a first related group of process steps. In this first group of process steps, the operator (1a) provides a heavily doped (n+) substrate 23 of resistivity substantially 0.005-0.01 Ohm-cm and thickness substantially 500 μm; (1b) provides a covering layer 25 of the same conductivity type as the substrate but of lower doping (resistivity substantially 1 Ohm-cm) and of thickness substantially 6-7 μm; (1c) provides an oxide of thickness substantially 0.6 μm on the surface of layer 25; (1d) provides a first mask over the oxidized surface of the covering layer 25 with a first aperture therein of diameter substantially 3-4 μm, and etches within the aperture; (1e) provides a thin implant oxide (not shown) of thickness substantially 450 Å on the upper silicon surface exposed by step 1d; (1f) uses ion implantation of second conductivity type (for example, B ions that correspond to dopant of p type) of energy substantially 60 keV and dose substantially $3.2 \times 10^{15}$ cm$^{-2}$ to convert an upper portion 27a of the covering layer 25 from n type (first conductivity type) to p+ type (second conductivity type) of thickness substantially 450 Å, as indicated in FIGS. 22A and 22B; (1g) provides an anneal and drive-in in the presence of $N_2$ gas for a time interval of substantially 10 minutes at a temperature of substantially $T=1050°$ C.; and (1h) provides a drive-in in the presence of wet $O_2$ for a time interval $\Delta t=60$ min. at a temperature of $T=950°$ C., leaving an oxide thickness (2600 Å) on the top surface of the structure including the p+ region.

In a second group of related process steps, indicated in FIGS. 23A and 23B, the operator (2a) provides a mask over the upper surface of the structure with a second aperture therein of predetermined size and position adjacent to and partly overlapping the first aperture (step 1c), and etches away the oxide [produced in the drive-in operation of steps (1g) and (1h)] that is exposed within the second aperture; (2b) provides a thin implant oxide (not shown) of thickness substantially 450 Å on the upper silicon surface exposed by step (2a); (2c) provides ion implantation of ions of second conductivity type (for example, B ions) of energy substantially 60 keV and dose substantially $2.7 \times 10^{13}$ cm$^{-2}$ to convert a second upper portion of the covering layer 25 from n type to p type, where the first ion implant region 27a (p+) and the second ion implant region 27b (p) may have an overlap region 27c in a lateral direction to provide a transition region from p to p+ as indicated in FIGS. 23A and 23B; (2-.d) provides a drive-in of the ions in regions 27a, 27b and 27c for a time interval of substantially 120 min. at a temperature of substantially $T=1150°$ C., and removes any oxide grown in regions 27b and 27c during this drive-in; (2e) provides a thin implant oxide layer of thickness substantially 300 Å on the upper silicon surface of regions 27b and 27c; (2f) provides a mask with a third aperture therein, the aperture exposing substantially all of the p region 27b and of the p/p+ transition region 27c; (2g) provides an ion implant of second conductivity type (for example, As) of energy substantially 80 keV and dose substantially $5.8 \times 10^{15}$ cm$^{-2}$ to convert an upper portion 28 (of thickness substantially 1600 Å) of the p region 27b and the p/p+ region 27c from second conductivity type (p) to heavily doped first conductivity type (n+), as illustrated in FIGS. 23A and 23B; and (2h) deposits low temperature oxide 34 as a mask over the upper surface of the structure, for later use as a trench mask.

Figure 24A:
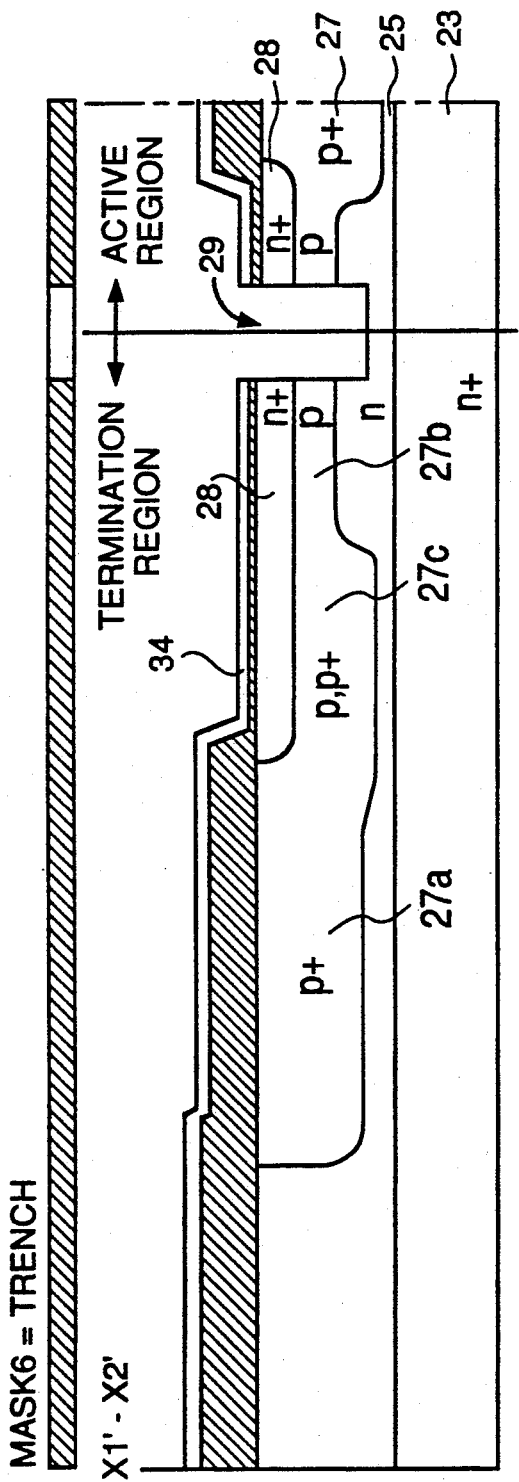
Figure 24B:
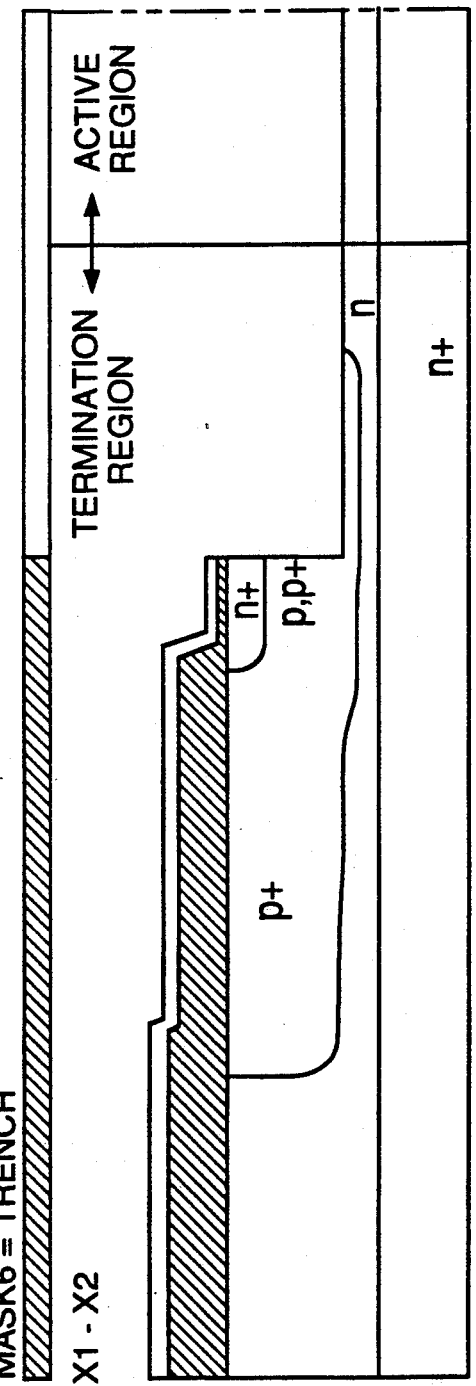

FIGS. 24A and 24B indicate the results of a third related group of process steps. In this third group of process steps, the operator (3a) provides a photoresist mask for selective etching of the low temperature oxide layer 34; (3b) removes the photoresist; (3c) uses a high anisotropy etch to produce a trench 29 that is substantially rectangular or trapezoidal in a vertical cross-section (FIG. 24A); the trench 29 has a predetermined depth relative to the top surface of the structure of substantially $d_{tr}=3-4$ μm; and (3d) removes the remaining low temperature oxide layer and the source implant oxide layer to expose the n+ area 28.

Figure 25A:
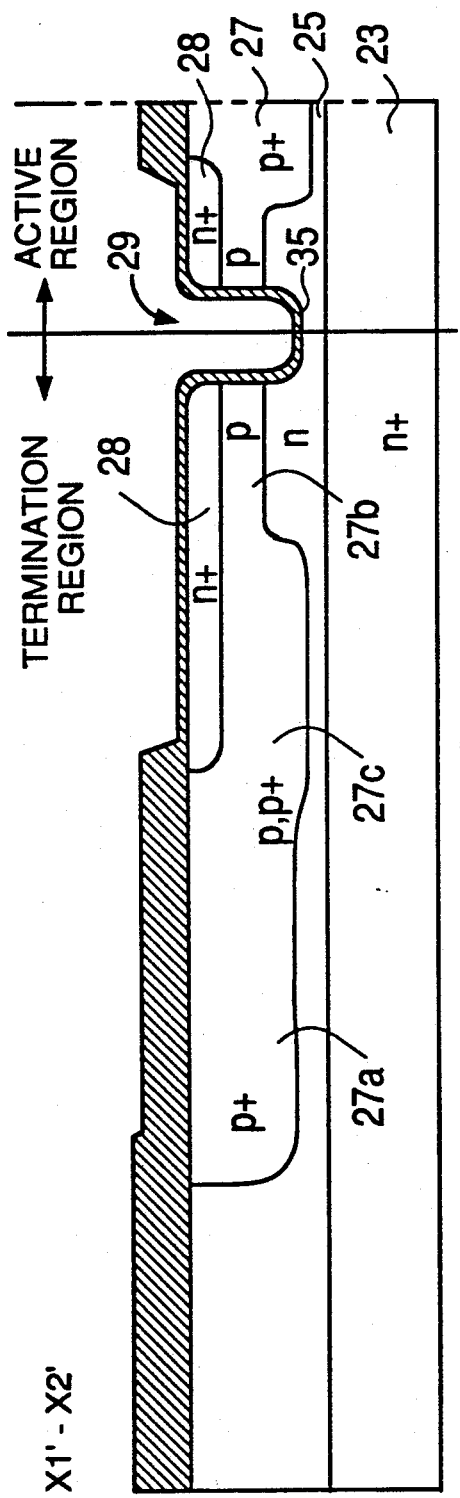
Figure 25B:
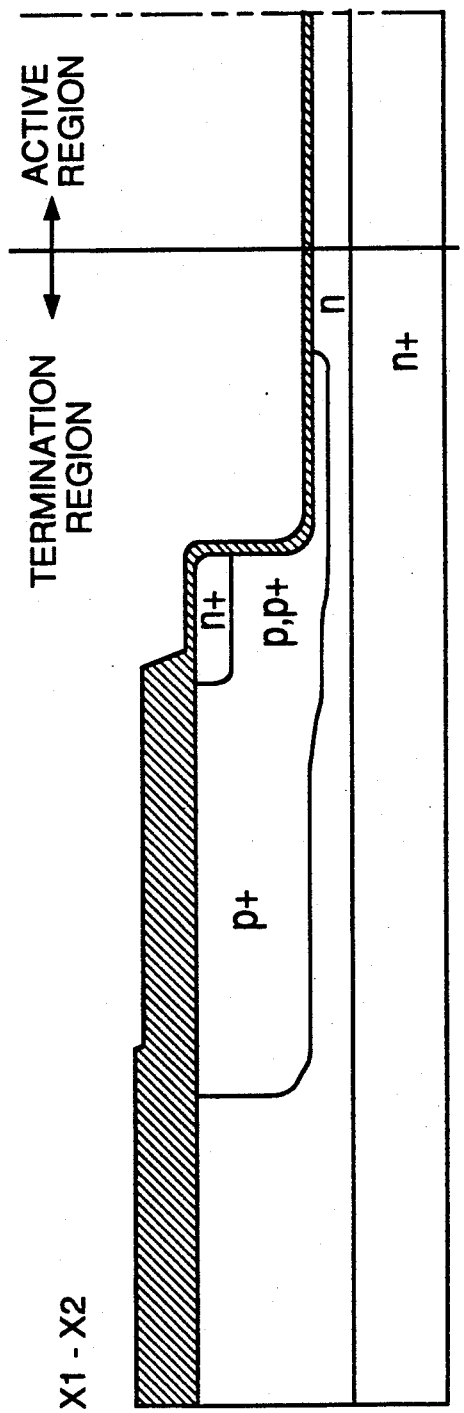

FIGS. 25A and 25B show the results of a fourth related group of process steps, wherein the operator (4a) grows a sacrificial oxide layer (not shown) of thickness substantially 3500 Å, using a steam environment at a temperature of substantially $T=1100°$ C. for a time interval of substantially $\Delta t=20$ min., over the upper surface of the structure including the exposed bottom and side walls of the trench 29; (1b) removes all of the sacrificial oxide layer, using a wet etch, leaving the rounded corners of the trench 29 produced by the sacrificial oxide growth; and (4c) grows a gate oxide layer 35 of thickness substantially 1200 Å, using a dry $O_2$ environment at a temperature of substantially $1050°$ C. for a time interval of substantially $\Delta t=90$ min.

FIGS. 26A and 26B show the results of a fifth related group of process steps, wherein the operator (5a) deposits a first polysilicon layer 36 (post-doped or doped in situ) of thickness substantially 7500 Å on the gate oxide layer 35, including the gate oxide on the bottom and side walls of the trench 29; and (5b) grows an oxide layer 37 (etch-stop oxide) of thickness substantially 1500 Å on the first polysilicon layer 36.

Figure 27A:
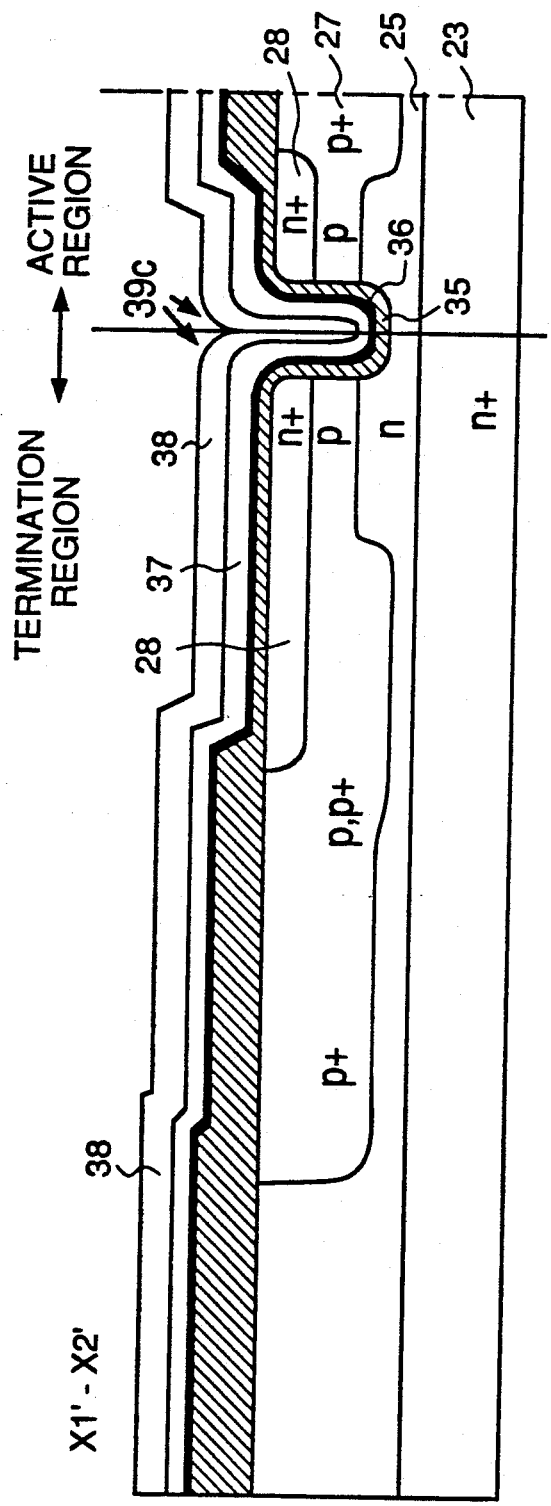
Figure 27B:
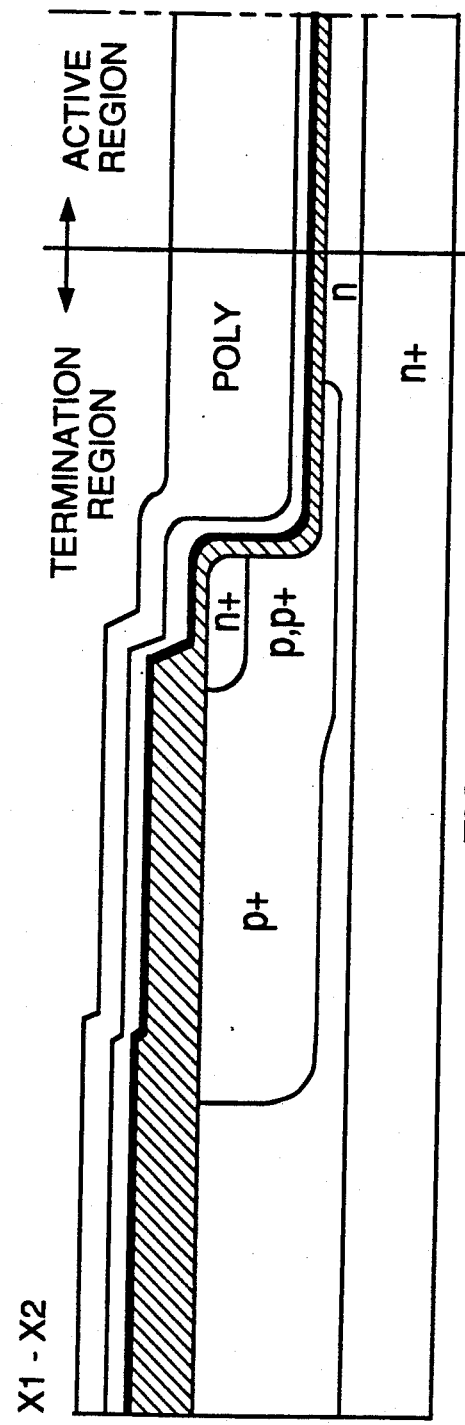

FIGS. 27A and 27B show the results of a sixth process step, wherein the operator (6a) deposits a second polysilicon layer 38 (undoped) of thickness substantially 3 μm over the oxide layer 37 and in the trench 29 to fill any portion of the trench that is not yet filled.

FIGS. 28A and 28B show the results of a seventh related group of process steps, wherein the operator (7a) removes substantially all of the second polysilicon layer 38 at the upper surface of the structure, not including the polysilicon deposited in the trench 29; this removes most or all of the cusp 39c that is otherwise manifest at the mouth of the trench 29 so that the upper surface of the structure is substantially planar; the etch-stop oxide layer 37 is used for monitoring purposes, to determine when to stop the etching process for the second polysilicon layer so that the process does not remove the remainder of the second polysilicon layer 38 from the trench; and (7b) removes the etch-stop oxide layer 37 from the upper surface of the structure, not including the portion of the etch-stop oxide layer that is located in the trench 29.

FIGS. 29A and 29B show the results of an eighth process step, wherein the operator (8a) masks and etches a portion of the exposed first polysilicon layer 36 that is adjacent to but not within the trench 29, for the cross-sectional view illustrated in FIG. 29A. As a result of this step, any electrical connection between the portion 36a of the first polysilicon layer that lies within the trench 29 and the portion 36b of the first polysilicon layer that lies outside the trench is severed in the area shown in this cross-section. The portion 36a of the first polysilicon layer that lies within the trench will be used for gate voltage control; electrical contact to this polysilicon layer is made through the continuous (unsevered) polysilicon shown in cross-section in FIG. 29B.

Figure 30A:
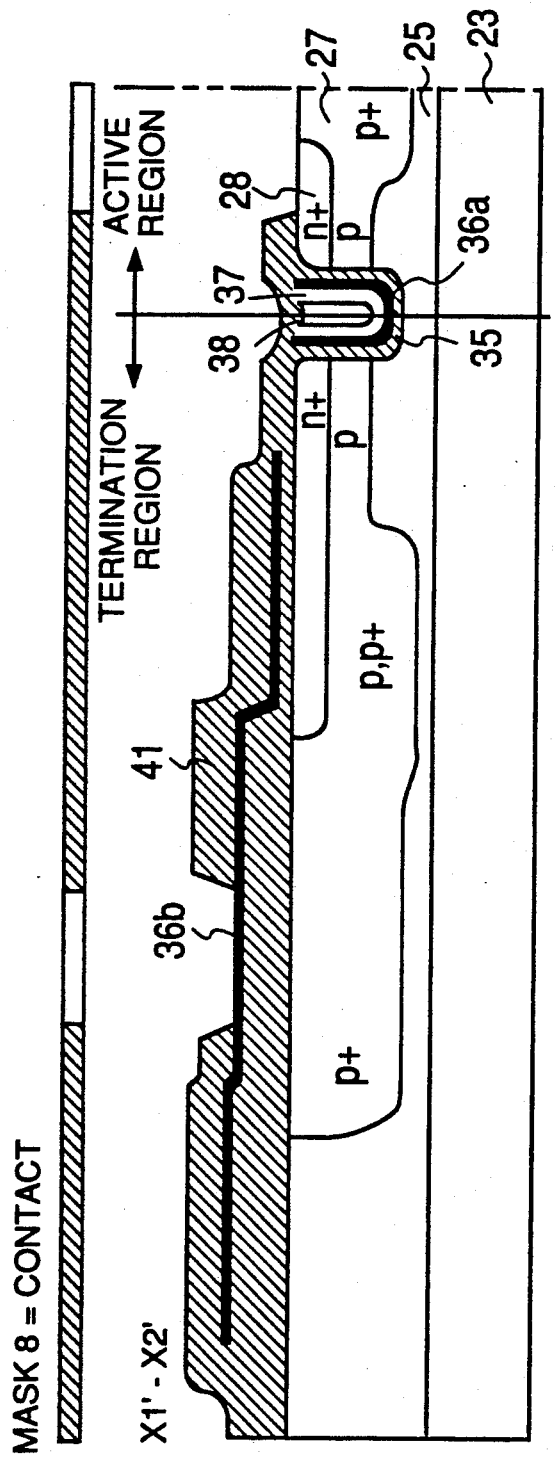
Figure 30B:
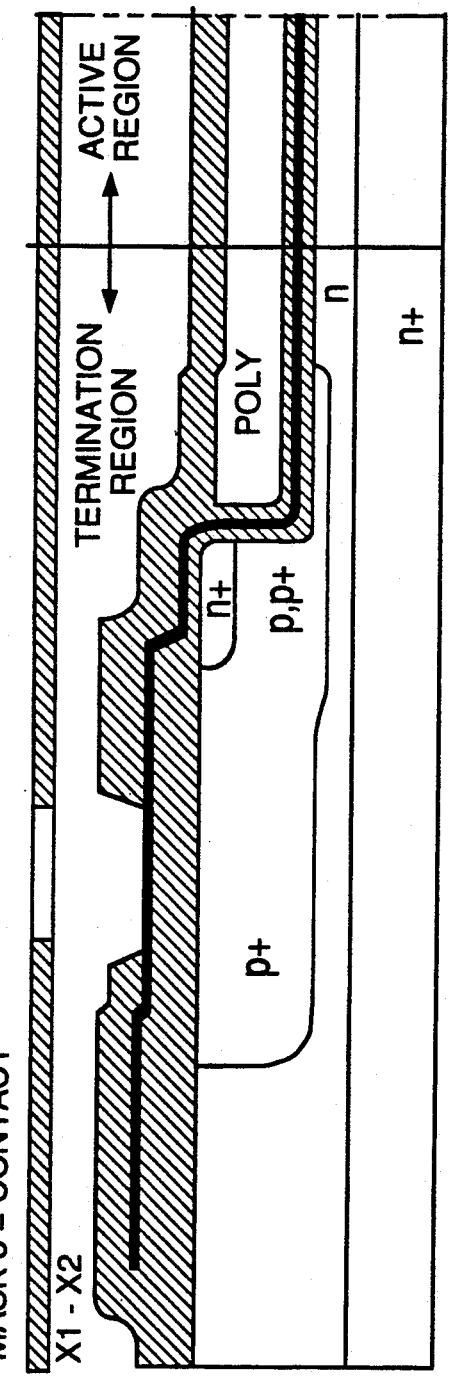

FIGS. 30A and 30B show the results of a ninth related group of process steps, wherein the operator (9a) grows a thin layer of oxide over the upper surface of the structure, including the two segments 36a and 36b of the first polysilicon layer; (9b) deposits a BPSG layer 41 of thickness substantially 0.8 $\mu$m at a temperature of substantially T=400° C. over the upper surface of the structure; (9c) applies a contact mask at selected positions on the BPSG layer 41 and etches apertures in the BPSG to open electrical contact areas for the source region 28, the heavily doped portion 27 of the body region and the gate (doped polysilicon) region 36b; and (9d) raises the temperature of the BPSG layer 41 to substantially T=900° C. for a time interval of substantially $\Delta$t=30 min. and allows reflow of the BPSG material to fill in and round off the sharp exposed areas produced by the contact area etch.

Figure 31A:
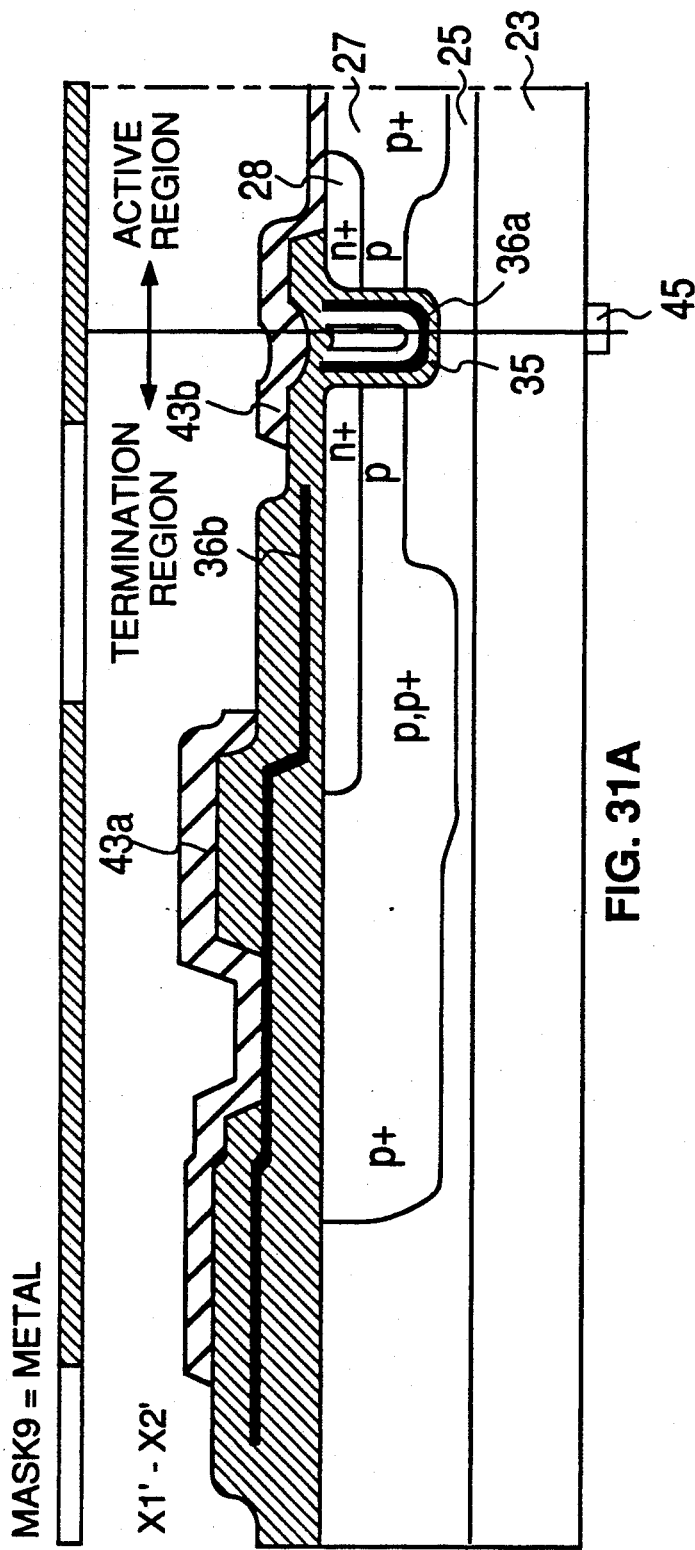
Figure 31B:
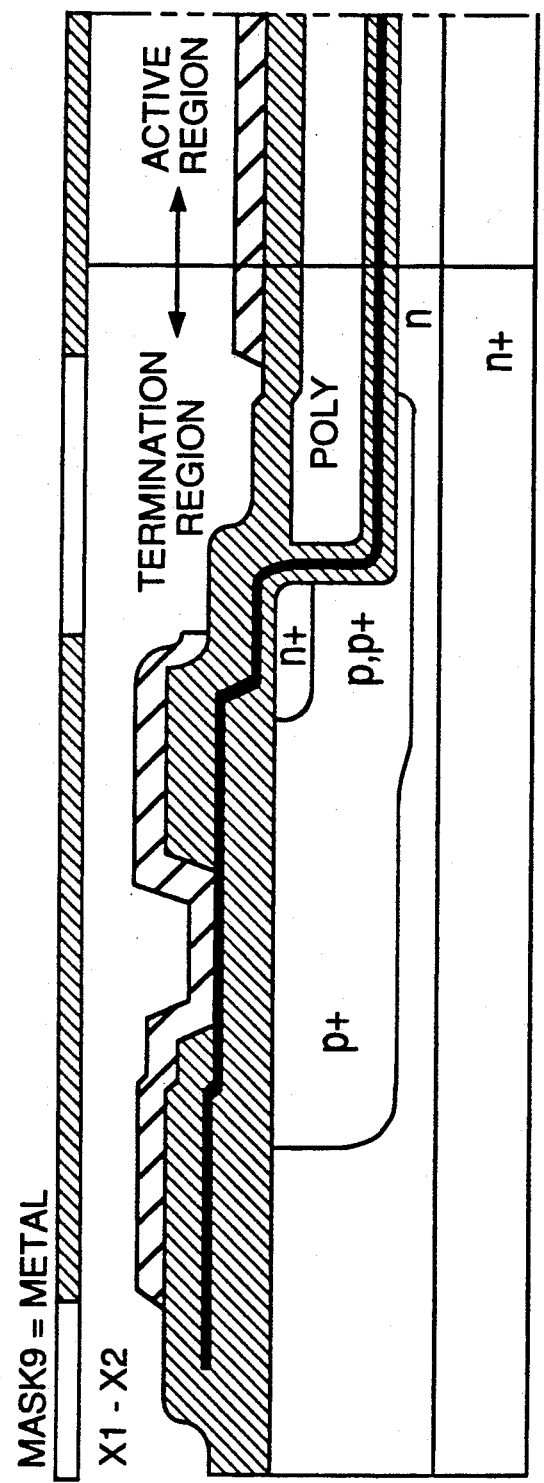

FIGS. 31A and 31B show the results of a tenth related group of process steps, wherein the operator (10a) deposits a metallization layer (for example, Al/Si) over the upper surface of the structure; (10b) masks and etches the metallization layer into separate regions 43a (gate) and 43b (source/body) to separate the gate and source/body contacts; (10c) alloys the metallization material with the silicon surface in regions 27 and 28, and with the doped polysilicon region 36b; (10d) deposits a passivation layer (not shown, optional) such as $Si_3N_4H_x$ by a PECVD process over the upper surface of the structure and etches apertures in the passivation layer to open electrical contact areas to the gate and source/body regions; and (10e) installs a drain contact 45 at the bottom surface of the substrate 23. The result of these process steps in one embodiment is the hexagonally-shaped transistor cell shown in a three-dimensional representation in FIG. 8.

FIG. 21 and FIGS. 22A/22B through 31A/31B illustrate the configuration and the process steps for the active region (where the transistor cells are located and where electrical contact is made to the source and body of the transistor), and for the field region that lies adjacent to the active region (where electrical contact is made to the gate).

The metallization layer 43b shown in FIG. 31A is used to control the voltage of the source region 28, and to assure electrical contact between the source region 28 and the p+ region 27, to maintain the source and body of the transistor at the same potential. This metallization layer is confined within the active region and is electrically isolated from the gate (doped polysilicon in the trench) by the BPSG layer 41, as shown in FIG. 31b.

Figure 32:
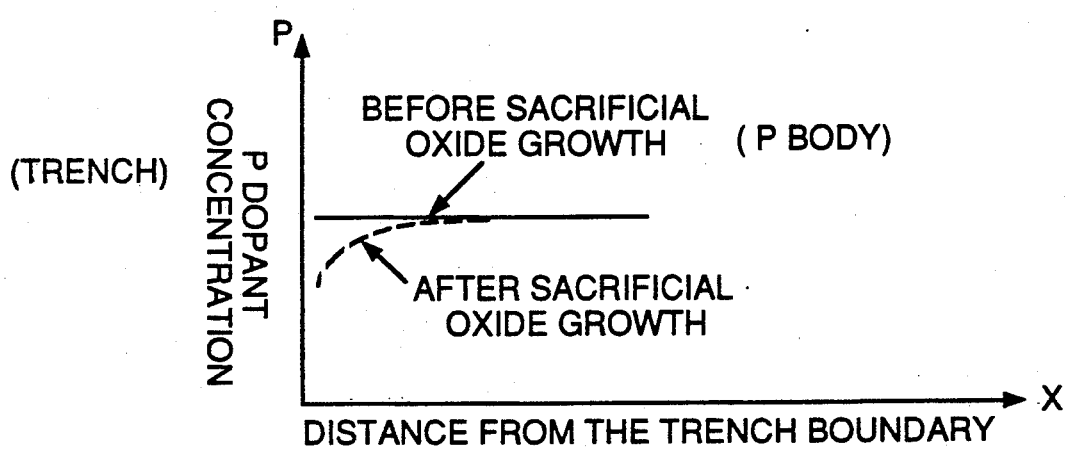
FIG. 32 is a graphic view comparing the p dopant concentration as a function of horizontal distance into the p body portion of the channel region of a transistor cell, before and after formation of the sacrificial oxide layer at the edge of the trench, as a result of preferential segregation of p dopant in the sacrificial oxide layer.

Because the source/body metallization layer 43b covers substantially all of the active region, the electrical contact to the gate must be made in the field region. In order to accomplish this, the trench 29 (containing the doped polysilicon) extends beyond the boundary of the active region to a portion of the field region 47 as shown in FIG. 21 and FIGS. 24A/24B. FIG. 29A indicates that, in the plane $X_1'X_2'$, a cut is made in the doped polysilicon layer on the top surface of the transistor cell so that the doped polysilicon is separated into a first portion 36a that is positioned within the trench 29 and a second portion 36b to which a metallization contact 43a is made as shown in FIG. 21 and FIG. 31A. However, FIG. 29B shows that in the plane $X_1X_2'$, the doped polysilicon remains uncut (continuous); it extends beyond the end of the trench protruding into the field region, and up onto the surface of the structure, where it makes electrical contact to the gate metallization layer 43a (FIG. 21 and FIG. 29B). The use of a gate contact that is positioned in a field area outside the active area of the array of transistor cells, ensures the continuity of gate electrode from its metallization contact through a layer of doped polysilicon to the oxidized trench sidewalls in the DMOS transistor cells. This gate contact approach is both topologically and technologically different from gate contact approaches used in planar DMOS transistors Growth of a sacrificial oxide layer at the edge of the trench 29, as discussed in connection with FIGS. 25A and 25B, has two other surprising and beneficial effects in configurations such as those shown in FIG. 8. Where a silicon dioxide layer is grown from a silicon layer that is possibly doped with p type dopant and/or n type dopant, the p type dopant will preferentially segregate in the silicon oxide and n type dopant will preferentially segregate in the silicon. FIG. 32 graphically illustrates p type dopant concentration in the body zone as a function of distance x from the edge of the trench oxide layer, before growth of the sacrificial oxide layer and after growth of this layer As a result of growth of this oxide layer contiguous to the p body zone 27, the p type dopant concentration decreases in the channel region adjacent to the oxide-silicon interface, as shown in FIG. 32. This allows the use of a higher p type dopant concentration in the p body zone 27, so that for a given value of threshold voltage in the channel region, the resistance between the channel and the body contact (p+ region 33) is reduced and bipolar breakdown (latchback) is suppressed.

Figure 33:
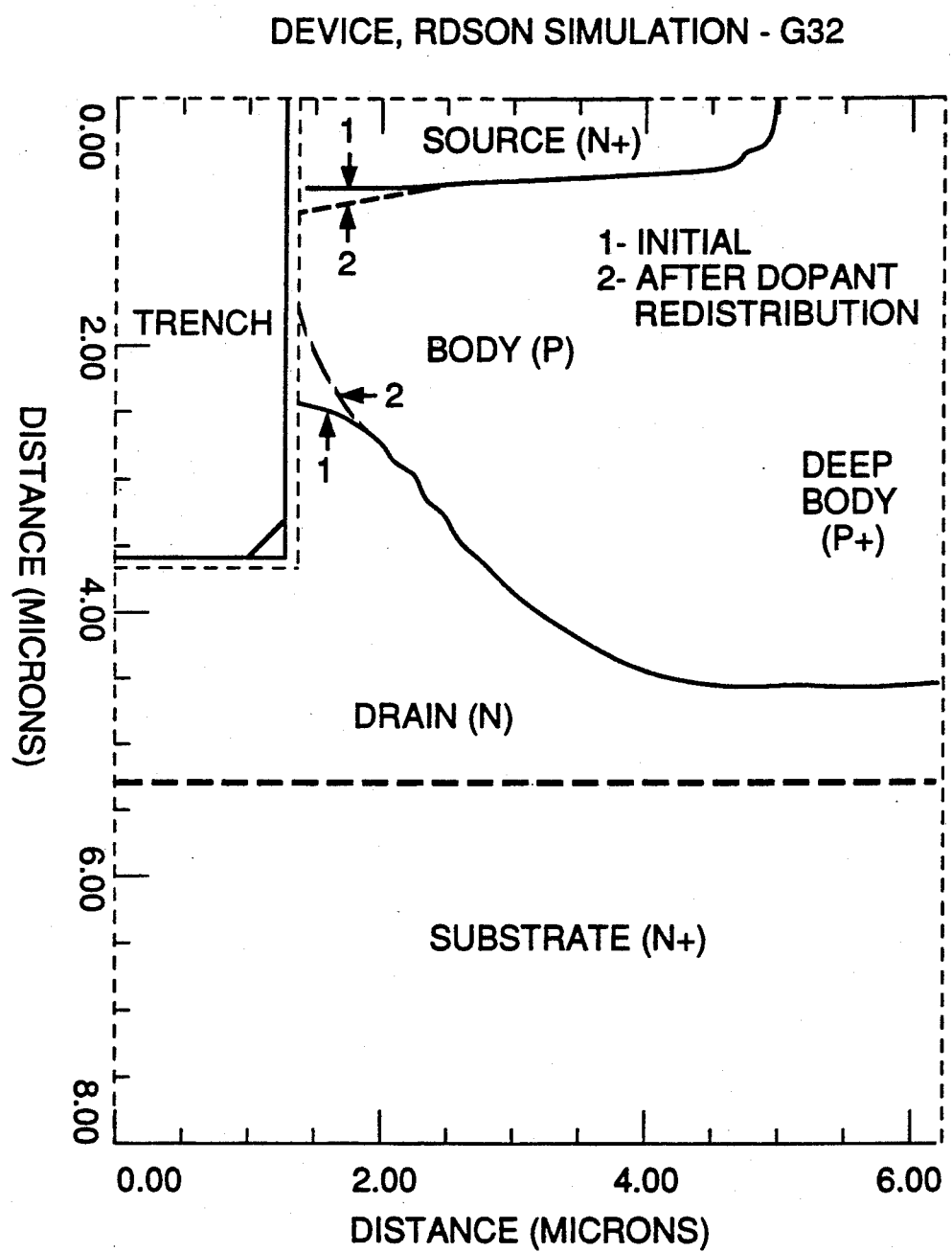
FIG. 33 is a graphic view of the n+region, p body region and n- epitaxial layer dopant profiles, before and after formation of the sacrificial oxide layer at the edge of the trench, as a result of preferential segregation of p dopant in the oxide layer and of n dopant in the silicon (n+ and n-).

FIG. 33 graphically illustrates the junctions or boundaries between portions of the n+ source region 28, the p body region 27 and the n- epitaxial region 25 that are adjacent to the interfaces of these regions with the trench 29 (or trench oxide layer), before and after growth of the sacrificial trench oxide layer. As a result of the growth of this oxide layer, the p type dopant concentration is reduced in the region 27 and the n type dopant concentration is increased in the regions 28 and 25. This results in a shortened channel length in the p body zone 27 from source region 28 to epitaxial region 25, which produces superior on-state resistance (i.e., a lower resistance value). The conventional method of producing short channel lengths in planar DMOS transistors begins with very shallow junctions; this approach severely limits the number of high temperature cycles that may be used in formation of the device. In the technique for achieving short channel lengths disclosed herein, the natural segregation of p type and n type dopants at an oxide-silicon interface is used to shorten the channel length; this approach does not appear to limit the number of high temperature cycles used in the formation of the device.

The preferred embodiment discussed here has used an n+source region 28, p/p+ body region 27, n epitaxial layer 25 and n+ drain region 23. The electrical conductivity types of each of these regions can be simultaneously exchanged (n type→p type, and p type→n type) with no qualitative change in the results.

For an n type substrate 23 (FIG. 8), substrate resistivity should be of the order of five milliohm-cm so that substrate doping concentration should be at least $10^{19}$ cm$^{-3}$; for a p type substrate the doping concentration should be somewhat higher. For an n type (p type) epitaxial layer 25, the resistivity should be about one Ohm-cm so that the doping concentration should be in the range $10^{15}$–$10^{16}$cm$^{-3}$ ($10^{16}$–$10^{17}$cm$^{-3}$). The heavily doped portion 27c of the body region 27 should be doped to at least $10^{18}$cm$^{-3}$ (surface dopant concentration), and preferably should have a surface dopant concentration of $5 \times 10^{18}$cm$^{-3}$ or greater. The lighter-doped portion of the body region 27 may be doped in the range $10^{16}$–$10^{17}$cm$^{-3}$; the details of the body profile are not critical, but they must be consistent with a $5 \times 10^{16}$cm$^{-3}$ peak body concentration for threshold voltage to be in the range of 2–3 V. The source region 28 must provide a good ohmic contact and should have a surface dopant concentration of at least $5 \times 10^{19}$cm$^{-3}$.

Although the preferred embodiments of the invention have been shown and described herein, variation and modification may be made without departing from the scope of the invention.

We claim:

1. A trench DMOS transistor cell comprising:
   a substrate of semiconductor material of heavily doped first electrical conductivity type;
   a first covering layer of semiconductor material of said first electrical conductivity type lying on the substrate;
   a second covering layer of semiconductor material of second electrical conductivity type lying on the first covering layer;
   a third covering layer of semiconductor material of heavily doped said first electrical conductivity type and having a top surface and partly lying over the second covering layer, wherein a portion of the second covering layer is heavily doped and this portion extends both vertically upward and downward, an upward portion extending through the third covering layer to the top surface of the third covering layer and a downward portion extending downward into the first covering layer;
   a trench having a bottom surface and side surfaces and extending vertically downward from the top surface of the third covering layer through the third covering layer and the second covering layer and through a portion of the first covering layer, wherein the bottom surface of the trench lies above a lowest part of the downward portion of the second covering layer;
   electrically conducting semiconductor material positioned within the trench;
   a layer of oxide positioned within the trench between the electrically conducting semiconductor material and the bottom and side surfaces of the trench; and
   three electrodes electrically coupled to the electrically conducting semiconductor material, to the third covering layer and to the substrate, respectively.

2. A trench DMOS transistor cell comprising:
   a substrate of semiconductor material of heavily doped first electrical conductivity type having a top surface;
   a first covering layer of semiconductor material of first electrical conductivity type having a top surface and being contiguous to and overlying the substrate top surface;
   a second covering layer of semiconductor material of second electrical conductivity type having a top surface and being contiguous to the top surface of the first covering layer and extending vertically downward from the top surface of the first covering layer into an upper portion of the first covering layer;
   a third covering layer of semiconductor material of heavily doped first electrical conductivity type having a top surface and being contiguous to and partly overlying the top surface of the second covering layer, wherein a portion of the second covering layer is heavily doped and this portion extends vertically upward through the third covering layer to the top surface of the third covering layer and forms an exposed pattern of the second covering layer adjacent in the top surface of the third covering layer, wherein the maximum depth of the heavily doped portion of the second covering layer relative to the top surface of the third covering layer is a predetermined number $d_1$, and wherein the depth of the top surface of the substrate at a position that underlies the position of maximum depth of the heavily doped portion of the second covering layer is a second predetermined number $d_2$;
   a trench having side surfaces and bottom surfaces and extending vertically downward from the top surface of the third covering layer through the third covering layer, through the second covering layer and through a portion of, but not all of, the first covering layer, the trench bottom surface having a maximum depth relative to the top surface of the third covering layer equal to a third predetermined number $d_3$ where $d_3 < d_1$, wherein the trench in horizontal cross section is approximately a polygonal stripe with stripe width approximately equal to a fourth predetermined number b, and wherein this polygonal stripe laterally surrounds and is spaced apart from the exposed pattern of the second covering layer at the top surface of the third covering layer;
   a layer of oxide, positioned within the trench and contiguous to the bottom surfaces and side surfaces of the trench so that a portion of, but not all of, the trench is filled with this oxide layer;

electrically conducting semiconductor material, having resistivity of approximately one ohm-cm, that is contiguous to the oxide layer and positioned within the trench so that this electrically conducting semiconductor material is spaced apart from the side walls and the bottom walls of the trench by the oxide layer; and three electrodes that are electrically coupled to the electrically conducting semiconductor material in the trench, to the third covering layer and to the substrate, respectively.

3. A cell according to claim 2, wherein said substrate has a doping concentration of at least $10^{18} cm^{-3}$.

4. A cell according to claim 2, wherein said first covering layer has a doping concentration in the range of $10^{15}$–$10^{17} cm^{-3}$.

5. A cell according to claim 2, wherein said vertically extending portion of said second covering layer has a doping concentration of at least $10^{18} cm^{-3}$.

6. A cell according to claim 2, wherein said third covering layer has a doping concentration at the top surface of at least $5 \times 10^{19} cm^{-3}$.

7. A cell according to claim 2, wherein the shape of said polygonal stripe is drawn from the class consisting of 8. A cell according to claim 2, wherein said second covering layer exposed pattern has the shape of a hexagon.

9. A cell according to claim 2, further comprising a second oxide layer contiguous to said electrically conducting semiconductor material within said trench.

10. A cell according to claim 9, further comprising a trench-filling semiconductor material that is contiguous to said second oxide layer within said trench and that substantially fills the remainder of said trench.

11. A cell according to claim 2, wherein the difference $d_1 - d_3$ between said predetermined numbers $d_1$ and $d_3$ is 0.5 μm or greater.

12. A cell according to claim 2, wherein the difference $d_2 - d_3$ between said predetermined numbers $d_1$ and $d_3$ is 0.5 μm or greater.

13. A cell according to claim 2, wherein said trench oxide layer has a thickness on said side surfaces and said bottom surfaces of said trench that lies in the range 0.1–0.2 μm.

14. The trench DMOS transistor cell according to claim 2, wherein said heavily doped portion of said second covering layer is centrally located within said polygonal stripe whereby that said heavily doped portion forces semiconductor avalanche breakdown to occur away from said trench.

* * * * *

UNITED STATES PATENT AND TRADEMARK OFFICE
CERTIFICATE OF CORRECTION

PATENT NO.   :   5,072,266

DATED        :   December 10, 1991

INVENTOR(S)  :   Constantin Bulucea et al.

It is certified that error appears in the above-identified patent and that said Letters Patent is hereby corrected as shown below:

In Claim 7, col. 17, line 27, after "of" add --a hexagon, a circle and an oval.--

Signed and Sealed this

Seventh Day of September, 1993

*Attest:*

BRUCE LEHMAN

*Attesting Officer*                *Commissioner of Patents and Trademarks*